United States Patent
Kojima et al.

(10) Patent No.: US 6,507,027 B1
(45) Date of Patent: Jan. 14, 2003

(54) APPARATUS AND METHODS FOR CHARGED-PARTICLE-BEAM MICROLITHOGRAPHY EXHIBITING REDUCED FOUR-FOLD ABERRATIONS

(75) Inventors: Shinichi Kojima, Kumagaya (JP); Koichi Kamijo, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/399,916

(22) Filed: Sep. 21, 1999

(30) Foreign Application Priority Data

Sep. 21, 1998 (JP) .......................................... 10-265890
Apr. 8, 1999 (JP) .......................................... 11-100893

(51) Int. Cl.$^7$ .......................... H01J 37/145; H01J 37/30
(52) U.S. Cl. ............... 250/396 R; 250/398; 250/492.23
(58) Field of Search .......................... 250/396 R, 398, 250/396 ML, 492.23

(56) References Cited

U.S. PATENT DOCUMENTS

| | | | | |
|---|---|---|---|---|
| 4,544,846 A | * | 10/1985 | Langner et al. | 250/396 R |
| 5,614,833 A | * | 3/1997 | Golladay | 250/310 |
| 5,747,819 A | * | 5/1998 | Nakasuji et al. | 250/492.23 |
| 6,078,054 A | * | 6/2000 | Nakasuji | 250/396 R |
| 6,255,663 B1 | * | 7/2001 | Yamada et al. | 250/492.23 |

FOREIGN PATENT DOCUMENTS

JP    2000164165 A  *  6/2000

OTHER PUBLICATIONS

Chu et al., "Numerical Analysis of Electron Beam Lithography Systems. Part III: Calculation of the Optical Properties of Electron Focusing Systems and Dual–Channel Deflection Systems with Combined Magnetic and Electrostatic Fields," *Optik 61*: 121–145 (1982).

Munro et al. "Numerical Analysis of Electron Beam Lithography Systems. Part 1: Compatution of Fields in Magnetic Deflectors," *Optik 60*:371–390 (1982).

* cited by examiner

*Primary Examiner*—Bruce Anderson
(74) *Attorney, Agent, or Firm*—Klarquist Sparkman LLP

(57) ABSTRACT

Charged-particle-beam microlithography apparatus are disclosed that exhibit minimal deflection aberrations while providing large-magnitude deflections of the charged particle beam using a relatively small excitation current. The apparatus comprises multiple deflectors. A representative deflector comprises a toroidal deflector coil having a semi-angle of 72° and a toroidal saddle deflector coil having a semi-angle of 36°. By adjusting the dimensions and number of windings of each coil, and the excitation current applied to each coil, magnetic-field components associated with cos[3φ] and with cos[5φ], which are higher-order components in the deflection field, are minimized. As a result, four-fold aberrations are minimized and deflection sensitivity is increased.

29 Claims, 10 Drawing Sheets

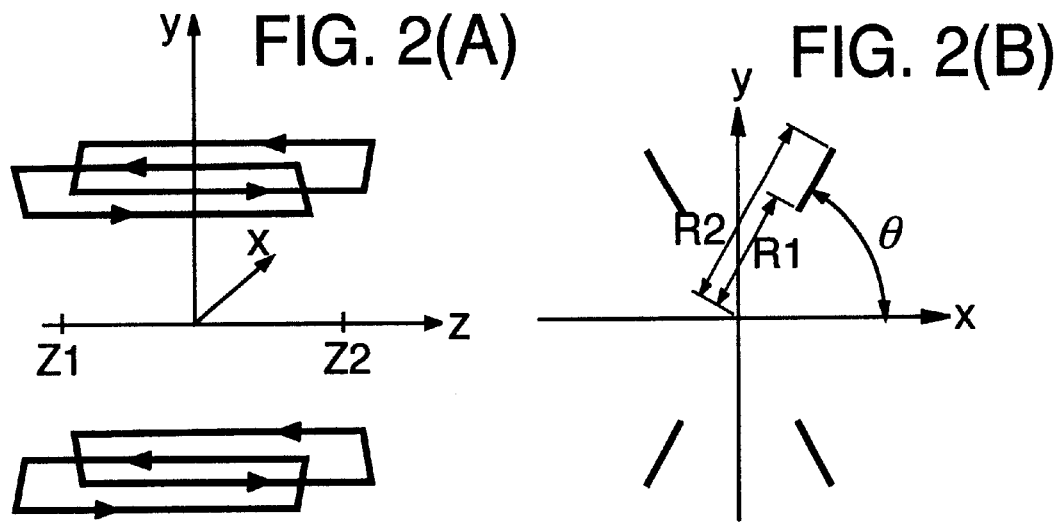
FIG. 2(A) FIG. 2(B)
FIG. 2(C)
|  |  | C1~C8 | P1~P4 |
|---|---|---|---|
| Length | Z2-Z1 (mm) | 45 | 27 |
| Inside Radius | R1 (mm) | 35 | 19 |
| Outside Radius | R2 (mm) | 74 | 47 |
| Coil Face Angle | θ (deg) | 60° | 60° |
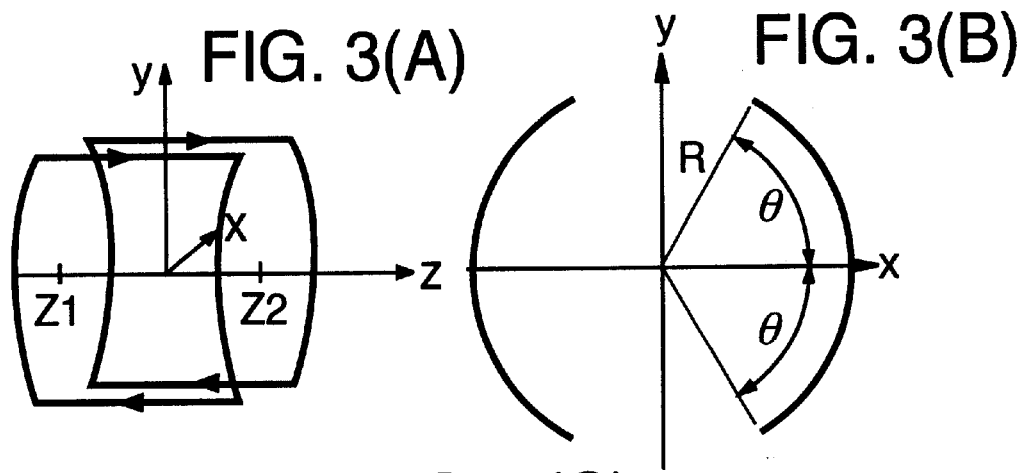
FIG. 3(A) FIG. 3(B)
FIG. 3(C)
|  |  | C1~C8 | P1~P4 |
|---|---|---|---|
| Length | Z2-Z1 (mm) | 45 | 27 |
| Outside Radius | R (mm) | 35 | 19 |
| Coil Face Angle | θ (deg) | 60° | 60° |

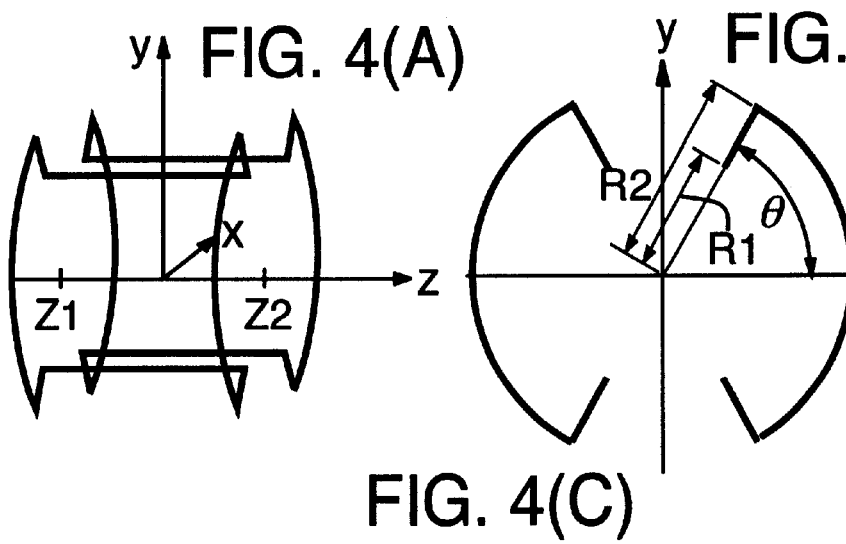
FIG. 4(A) FIG. 4(B)
FIG. 4(C)
|  |  | C1~C8 | P1~P4 |
|---|---|---|---|
| Length | Z2-Z1 (mm) | 45 | 27 |
| Inside Radius | R1 (mm) | 35 | 19 |
| Outside Radius | R2 (mm) | 74 | 47 |
| Coil Face Angle | θ (deg) | 60° | 60° |
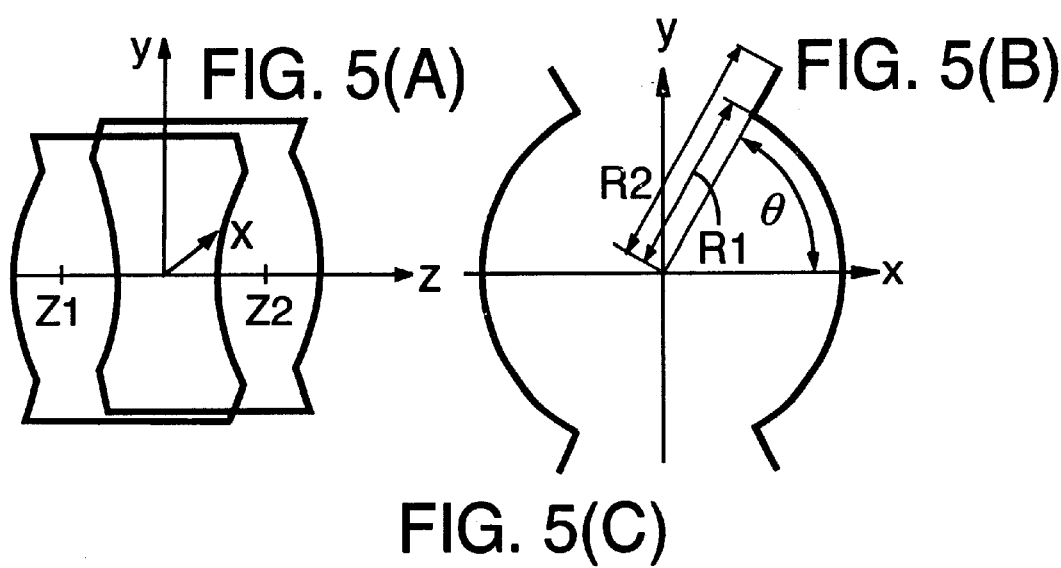
FIG. 5(A) FIG. 5(B)
FIG. 5(C)
|  |  | C1~C8 | P1~P4 |
|---|---|---|---|
| Length | Z2-Z1 (mm) | 45 | 27 |
| Inside Radius | R1 (mm) | 35 | 19 |
| Outside Radius | R2 (mm) | 74 | 47 |
| Coil Face Angle | θ (deg) | 60° | 60° |

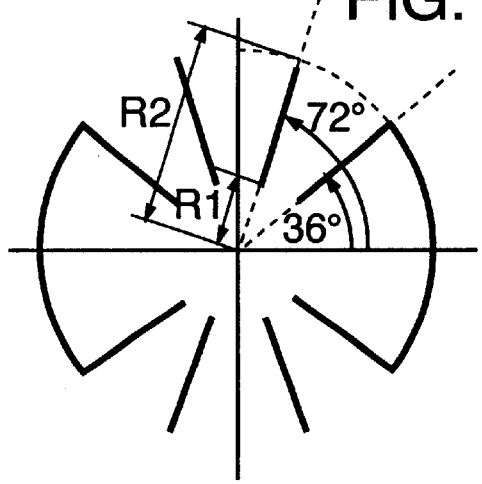
FIG. 7(A)
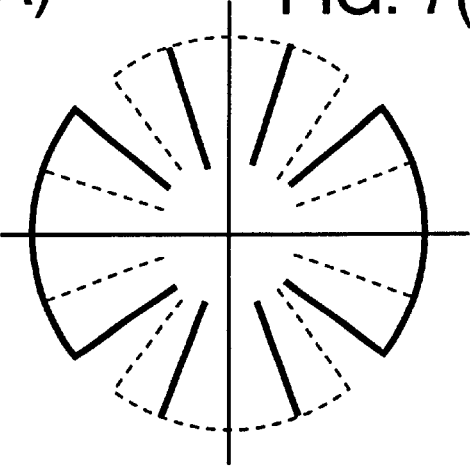
FIG. 7(B)
FIG. 7(C)
|  |  | C1~C8 | P1~P4 |
|---|---|---|---|
| Length | Z2-Z1 (mm) | 45 | 27 |
| Inside Radius | R1 (mm) | 35 | 19 |
| Outside Radius | R2 (mm) | 74 | 47 |
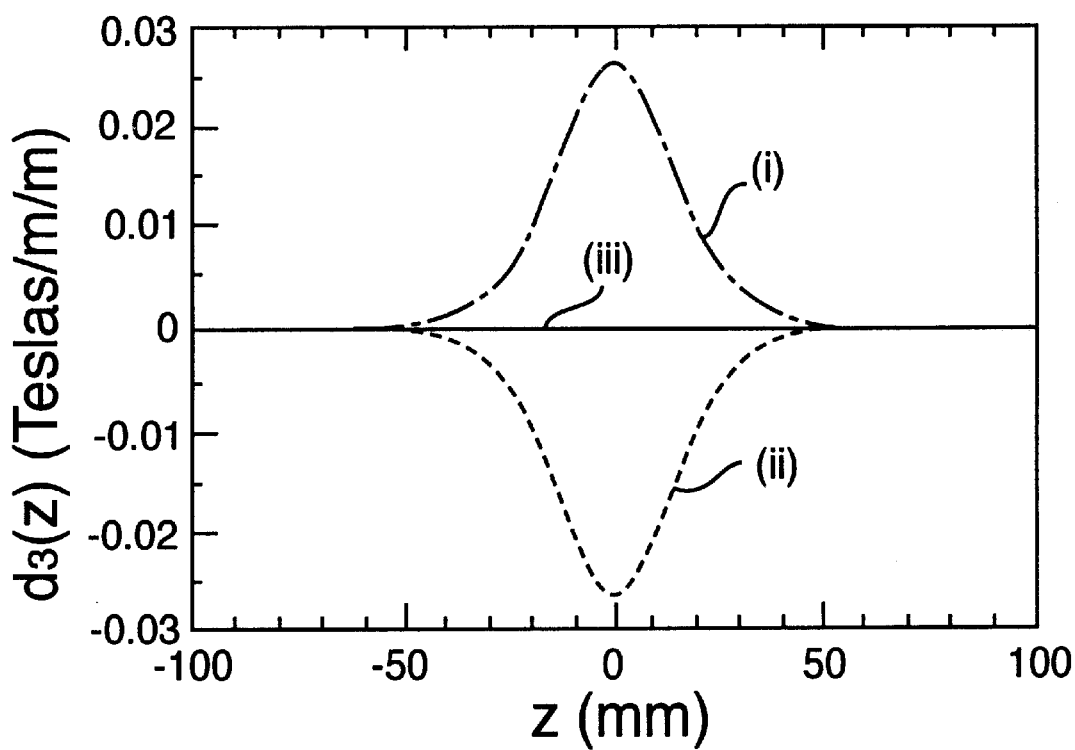
FIG. 8

FIG. 9(A)
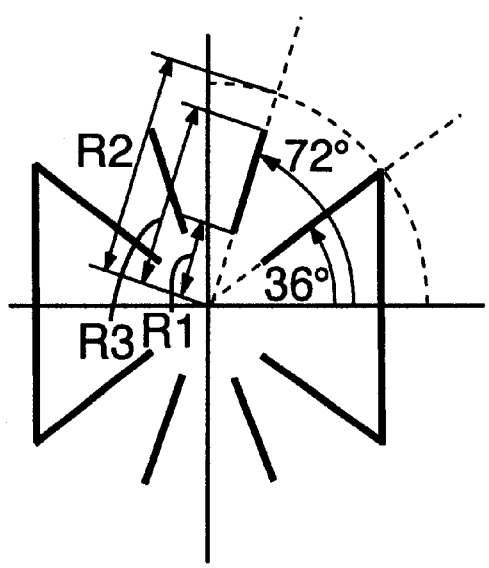
FIG. 9(B)
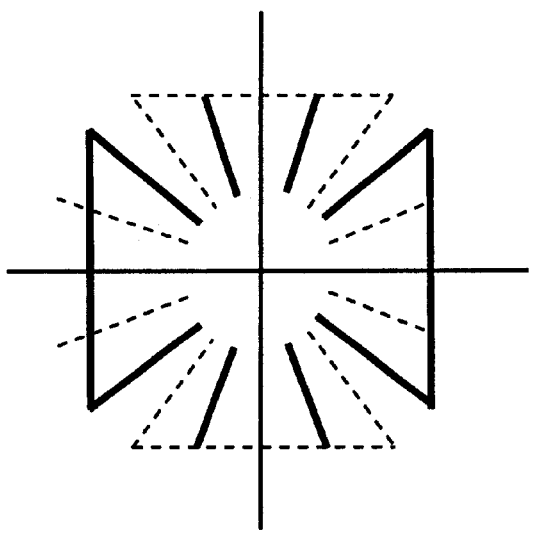
FIG. 9(C)
|  |  | C1~C8 | P1~P4 |
|---|---|---|---|
| Length | Z2-Z1 (mm) | 45 | 27 |
| Inside Radius | R1 (mm) | 35 | 19 |
| Outside Radius | R2 (mm) | 74 | 47 |
|  | R3 (mm) | 63 | 40 |

|  | | C1~C8 | P1~P4 |
|---|---|---|---|
| Length | Z2-Z1 (mm) | 45 | 27 |
| Inside Radius | R1 (mm) | 35 | 19 |
| Outside Radius | R2 (mm) | 74 | 47 |

|  | | C1~C8 | P1~P4 |
|---|---|---|---|
| Length | Z2-Z1 (mm) | 45 | 27 |
| Inside Radius | R1 (mm) | 35 | 19 |
| Outside Radius | R2 (mm) | 74 | 47 |

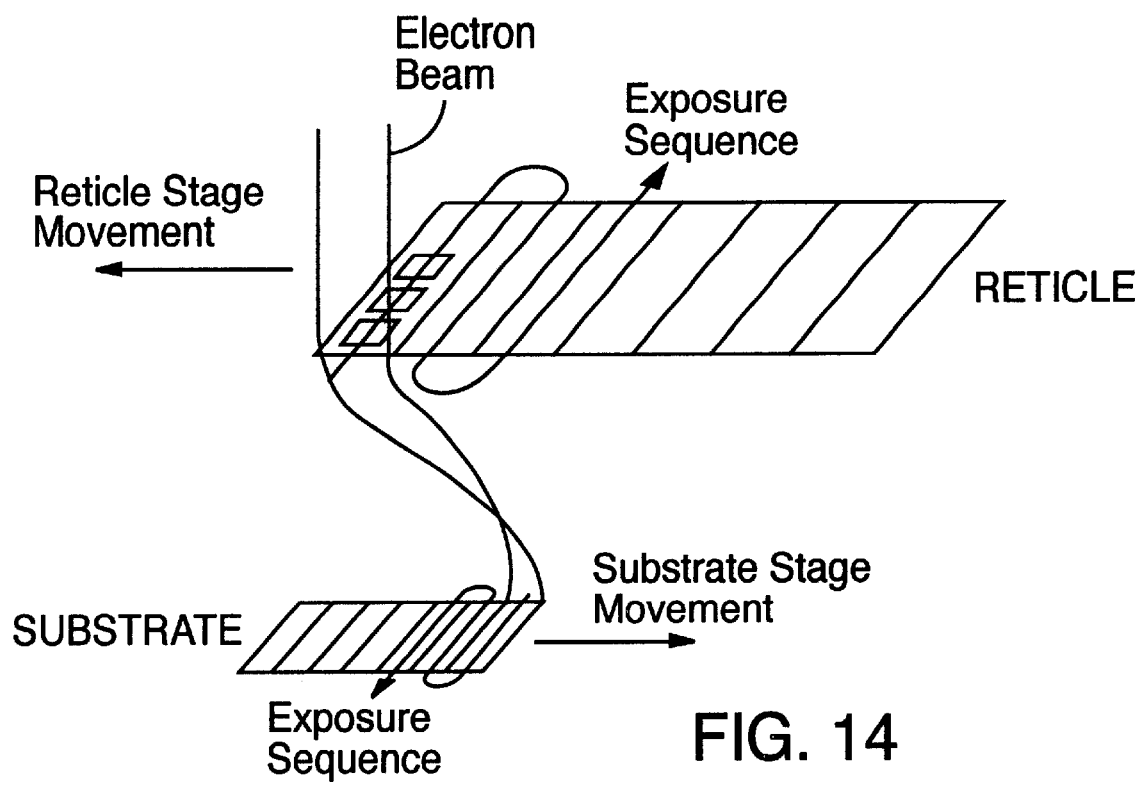
FIG. 14
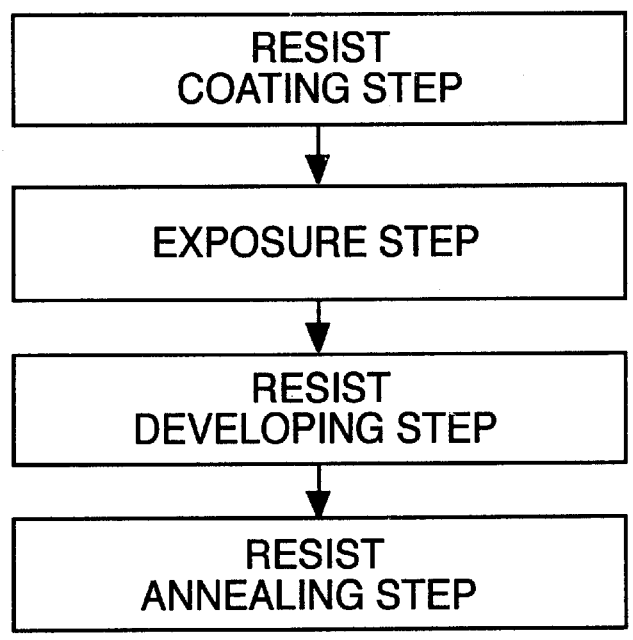
LITHOGRAPHY STEP      FIG. 16

APPARATUS AND METHODS FOR CHARGED-PARTICLE-BEAM MICROLITHOGRAPHY EXHIBITING REDUCED FOUR-FOLD ABERRATIONS

FIELD OF THE INVENTION

This invention pertains to microlithography apparatus and methods for use, e.g., in the manufacture of semiconductor integrated circuits, displays, and the like. The subject apparatus and methods utilize a charged particle beam (e.g., electron beam or ion beam) as an energy beam for transferring a pattern, defined by a reticle or mask, onto a sensitive substrate (e.g., semiconductor wafer or the like). More specifically, the invention is directed to such apparatus and methods exhibiting reduced deflection aberrations even while effecting large beam deflections.

BACKGROUND OF THE INVENTION

Conventional exposure formats in charged-particle-beam (CPB) microlithography apparatus can be categorized into the following three types:

(1) Spot-beam exposure
(2) Variable shaped beam exposure
(3) Block exposure

Although these exposure formats exhibit superior resolution compared with conventional batch-transfer systems employing visible light as an energy beam, they exhibit disappointingly low "throughput" (number of substrates or wafers that can be processed per unit time). Throughput is especially low with exposure formats (1) and (2) because the patterns are exposed by being traced with a beam having an extremely small spot radius or having an extremely small square transverse profile.

The block exposure format (3) was developed to improve throughput. In block exposure, uniformly shaped features are defined on a reticle, and portions of the reticle containing such features are exposed one shot at a time in batches. Because the number of features that can be placed on a reticle is limited in this format, a variable-profile exposure system must be used. Consequently, throughput is not improved as much as would otherwise be expected.

In order to further improve throughput, so-called "divided" projection-transfer apparatus have been developed. In such apparatus, the reticle defining a pattern is divided into multiple portions or "exposure units" that are individually projection-exposed onto the substrate. Each exposure unit requires a respective "shot" (exposure) using the energy beam.

Certain aspects of a conventional divided projection-transfer apparatus are depicted in FIGS. 13 and 14. Referring first to FIG. 13, an entire substrate (wafer) W is shown containing multiple "chips" C. Each chip C contains multiple "stripes" S, and each stripe S contains multiple "subfields" SF (as representative exposure units). The reticle (not shown) defining the pattern for each chip C is similarly divided into multiple stripes and subfields.

Each subfield SF is individually exposed. Exposure is normally performed in a manner as shown in FIG. 14, in which the reticle is situated upstream of the substrate. As a charged particle beam (e.g., electron beam) illuminates each subfield on the reticle, the respective portion of the pattern is projected by a projection-optical system (not shown but understood to be located between the reticle and the substrate) onto the substrate, thereby imprinting the pattern portion onto a respective region of the substrate. The subfields in each stripe are arranged in columns. The columns are sequentially exposed, and the subfields in each column are sequentially exposed. To effect serial exposure of the columns, the reticle and substrate (which are mounted on respective stages that are not shown) undergo relative linear motions in respective scan directions at respective constant scan velocities. The respective scan velocities of the reticle stage and wafer stage are established by, inter alia, the demagnification ratio of the projection-optical system.

Before reaching the reticle, the charged particle beam (generated by a suitable source) passes as an "illumination beam" through an "illumination-optical system" located upstream of the reticle. To expose the subfields in each column of a stripe on the reticle, the illumination beam is deflected (by appropriately situated deflectors in the illumination-optical system) in a direction roughly perpendicular to the direction of linear motion of the reticle stage. Thus, the subfields in each stripe are sequentially exposed by the illumination beam in a raster manner. After passing through the reticle, the beam (now termed the "patterned beam") passes through a "projection-optical system" to the substrate. The illumination-optical system and projection-optical system are collectively termed the "CPB optical system." As each column of subfields is exposed, the reticle and substrate are moved in opposite directions to position the next column of subfields in the stripe for exposure. To improve throughput, each subsequent column of subfields is exposed by deflecting the charged particle beam in a direction opposite the direction in which the beam was deflected in the previous column, as shown in FIG. 14.

The subfields on the reticle are separated from one another by struts. The struts strengthen and add rigidity to the reticle, and also facilitate the illumination of only one subfield per shot.

To improve throughput, the illumination beam usually has a relatively high beam current. However, high beam currents tend to introduce significant image blur due to Coulomb effects. A conventional approach for reducing such Coulomb effects is to enlarge the area being exposed per shot and to subject the illumination beam to a relatively high acceleration voltage.

Throughput can also be increased by increasing the maximum beam deflection (i.e., maximum angle with which the beam is laterally deflected) to expose the subfields in each column. By increasing the beam deflection, the length of each column (and thus the width of each stripe) can be increased. I.e., by increasing the width of the stripes, fewer stage movements are required during exposure of the entire reticle pattern. Hence, the cumulative time required to perform stage movements (to expose the subsequent column of subfields or to begin exposing the next stripe of the pattern) during exposure of the reticle pattern is decreased, and throughput is correspondingly increased. Unfortunately, however, a beam experiencing a higher-magnitude deflection must pass through a subfield (located at an end of a column) that is widely separated from the optical axis of the CPB-optical system. Such a high-magnitude deflection generates more deflection aberrations than a lesser-magnitude deflection. The conventional manner of reducing such aberrations is to adjust the excitation current supplied to the deflectors used to deflect the beam and to manipulate the deflection trajectory of the beam so as to minimize deflection aberrations.

Because the magnitude of beam deflection is proportional to the excitation current applied to the deflector, a large excitation current must be impressed on the deflector in order to impart a large-magnitude deflection on the beam.

Also, because it is desirable to deflect and scan the beam at high speeds, a driver circuit supplying electrical power to the deflector should be capable of changing the electrical power very rapidly with each subfield. Unfortunately, an electrical circuit capable of performing sufficiently high-speed changes of a high output power is technically difficult and expensive to design. Consequently, there is an urgent need to provide deflectors that can produce as large a deflection as possible using a relatively small electrical current.

The accuracy with which deflectors are manufactured is also crucial for controlling aberrations. Deflectors usually comprise wound coils of an electrical conductor (wire). The conductor itself has a limited thickness, and the accuracy and precision with which most electrical conductors are fabricated are usually not high. As a result, extraneous magnetic fields outside the main deflection field are usually simultaneously generated by the deflector. The distribution of the magnetic field can be expressed using a cylindrical coordinate system (z,r,φ), in which φ is the rotational angle around the optical axis, r is the radial coordinate and z is the axial coordinate. The reflection field is expressed by the lowest-order trigonometry functions cos[φ], sin[φ], but the magnetic field located outside the deflection field is expressed in terms that are proportional to certain higher odd-ordered trigonometric functions cos[3φ] sin[3φ], cos [5φ], sin[5φ], etc. These higher-order components do not contribute to the deflection of the beam, but do generate group of aberrations referred to as "four-fold aberrations" (see E. Munro and H. C. Chu, *Optik* 60:371–390, 1982); and H. C. Chu and E. Munro, *Optik* 61:121–145, 1982. Because these four-fold a aberrations tend to cause blurring of the image formed by the charged particle beam and undesired changes in the shape of the transfer field, the aberrations are desirably eliminated as much as possible.

Certain deflectors are known in the art that control four-fold aberrations (see Chu and Munro, *Optik* 61:121–145, 1982, and Orloff (ed.), *Handbook of Charged Particle Optics*, CRC Press, 1997). However, because the conductors used in deflector coils are thick and deflector fabrication is difficult, it is actually very difficult to produce a deflector with sufficient fabrication accuracy and precision for adequately suppressing four-fold aberrations. Whereas so-called "saddle" and "compound saddle" deflectors have the advantages of high deflection sensitivity and relatively low excitation current compared with toroidal deflectors, it is very difficult to fabricate saddle and compound saddle deflectors with high precision accuracy due to the complex shapes of such deflectors.

Summary and General Aspects of the Invention

The present invention addresses the shortcomings of conventional technology summarized above. An object of the invention is to provide charged-particle-beam (CPB) projection-exposure apparatus that can perform large-magnitude deflections of the charged particle beam at low excitation currents and with minimal deflection aberration.

According to one aspect of the invention, CPB exposure apparatus are provided that transfer a pattern, defined on a reticle, onto a sensitive substrate. A first representative embodiment of such an apparatus comprises, inter alia, at least one deflector comprising an "inner compound saddle" coil. An inner compound saddle coil has a shape representing a combination of a toroidal coil and a saddle coil. However, a toroidal coil, in contrast to an inner compound saddle coil, has a shape protruding toward the outside of the saddle coil. Hence, the current necessary to impart a particular deflection to the beam using an inner compound saddle coil is substantially reduced (i.e., the deflection sensitivity is correspondingly increased) without compromising blur or distortion compared to a conventional toroidal coil.

In a second representative embodiment, at least one deflector comprises at least two independent deflector coils of different type. Such deflector coils mutually cancel out higher-order components of the magnetic fields generated by the deflector coils. Such canceling out is facilitated by adjusting the respective shape and excitation current of each deflector coil. Consequently, deflection distortion is minimized. By having at least one of the deflector coils being a high-deflection-sensitivity deflector coil, deflection sensitivity is desirably increased overall and larger magnitudes of deflection are desirably obtained at lower excitation currents. The more deflectors having two or more independent deflector coils, the greater the desirable effects obtained. Best results are obtained if all of the deflectors are of such a configuration. The minimum number of deflectors of this configuration is appropriately determined according to the specifications demanded by the CPB exposure apparatus.

In the second representative embodiment, the deflector can comprise an inner compound saddle deflector coil. With such a configuration, the current necessary to achieve a desired deflection is vastly reduced (with a corresponding increase in deflection sensitivity), without compromising blur or distortion compared to a toroidal coil.

Alternatively, the deflector can comprise a combination of a toroidal deflector coil and a saddle deflector coil. The saddle deflector coil is desirably situated coaxially with the toroidal deflector coil at the same position along the optical axis such that the deflectors can be used in combination as a single deflector. With such a configuration, the excitation current required to generate a magnetic field of a desired magnitude can be distributed between the coils and correspondingly reduced, allowing a smaller deflector driver to be used. Since single saddle deflectors and deflectors comprising only saddle deflector coils are difficult to fabricate with high accuracy, such fabrication problems are considerably reduced by combining a saddle coil with a toroidal coil. The respective excitation currents applied to the saddle deflector coil and to the toroidal deflector coil can be fine-tuned. Such tuning achieves an adjustment of the magnetic field generated by the deflector so that magnetic field components proportional to cos[3φ], sin[3φ], cos[5φ], and sin[5φ] (all of which being factors that influence the occurrence of four-fold aberrations) are satisfactorily reduced.

In a deflector comprising a combination of a toroidal deflector coil and a saddle deflector coil, the semi-angle of the saddle deflector coil can be 45° or less. By configuring the saddle deflector coil in such a manner, the X-direction deflector and the Y-direction deflector can be situated at the same axial position, which simplifies the manufacture of the deflector and hence of the CPB optical system. Such a configuration also further suppresses four-fold aberrations.

Further with respect to a deflector comprising a combination of a toroidal deflector coil and a saddle deflector coil, the semi-angle of the toroidal deflector coil can be approximately 72°, and the semi-angle of the saddle deflector coil can be approximately 36°. With such a configuration, a magnetic field component proportional to cos[5φ] has zero magnitude, which suppresses higher-order aberrations derived from the magnetic field component. In addition, the magnetic field component proportional to cos[3φ] can be reduced to nearly zero magnitude by individually adjusting the excitation currents flowing through these two coils, thereby permitting suppression of higher-order aberrations derived from this component.

The term "approximately" is used in the context of these semi-angles because, whereas it is ideal that the semi-angles be exactly 72° and 36°, respectively, a certain deviation from the ideal values is allowable. The amount of allowable variation depends on, inter alia, the design precision demanded in the CPB exposure apparatus, and can be readily determined by a person of ordinary skill in the relevant art. In this regard, the terms "approximately" and "nearly" are used interchangeably herein.

In a deflector comprising a combination of two or more toroidal deflector coils and one saddle deflector coil, the semi-angle of the first toroidal deflector coil is desirably approximately 54°, the semi-angle of the second toroidal deflector coil is desirably approximately 90°, and the semi-angle of the saddle deflector coil is desirably approximately 18°. Such a configuration is effective in suppressing components proportional to $\cos[3\phi]$ and to $\cos[5\phi]$. Indeed, with such a configuration, $\cos[5\phi]$ components essentially do not appear even if the semi-angle setting for each coil varies from the respective optimal design value of 18°, 54°, and 90°. This is because the integral value of $\phi$ of the magnetic field generated at 5 times the semi-angles of 18°, 54°, and 90° for each coil, viz., $\cos[5\theta]$, is zero at each of these semi-angles. As a result, the magnetic field is especially stable.

In a deflector comprising a saddle deflector coil and a toroidal deflector coil, the saddle deflector coil can be replaced with a plane-parallel coil residing in a plane not intersecting the optical axis. Such a "modified" saddle deflector coil lacks curved surfaces, thereby simplifying the coil profile. Simplifying the coil profile in this manner facilitates high-precision fabrication of the coil and minimizes unexpected aberrations resulting from assembly error.

In a deflector comprising at least one toroidal deflector coil and a compound saddle deflector coil, the semi-angle of the compound saddle deflector coil can be 45° or less. For example, the semi-angle of the compound saddle deflector coil can be approximately 36°, with the semi-angle of the toroidal deflector coil being approximately 72°. By way of another example, the deflector can comprise two toroidal deflector coils and one saddle deflector coil. In such a configuration, the semi-angle of the first toroidal deflector coil can be approximately 54°, with the semi-angle of the second toroidal deflector coil being approximately 90° and the semi-angle of the compound saddle deflector coil being approximately 18°. By way of yet another example, the semi-angle of the first toroidal deflector coil can be approximately 69.5°, the semi-angle of the second toroidal deflector coil can be approximately 90°, and the semi-angle of the compound saddle deflector coil can be approximately 39°. In any event, since the $\cos[3\phi]$ component and the $\cos[5\phi]$ component are 0 (zero) in these configurations, the respective currents flowing through each coil can be the same. This allows a single coil driver to serve multiple coils, thereby lowering costs.

In a deflector according to the invention, the excitation current supplied to at least one of the deflector coils can be set independently of the excitation currents supplied to the other deflection coils of the deflector. Thus, it is easier for the $\cos[3\phi]$ component and the $\cos[5\phi]$ component to be made zero.

The Ampere-Turn value of the respective deflector coils in a deflector according to the invention that comprises a combination of toroidal deflector coils, saddle deflector coils, and/or compound saddle deflector coils can be set so as to fulfill the following Equation (1):

$$\sum_{i=1}^{l} JT_i \cdot I_{OT3}(T(R1)_i, T(R2)_i, T(Zl)_i, T\theta_i) + \qquad (1)$$

$$\sum_{j=1}^{m} JS_j \cdot I_{OS3}(SR_j, S(Zl)_j, S\theta_j) +$$

$$\sum_{k=1}^{n} JC_k \cdot I_{OC3}(C(R1)_k, C(R2)_k, C(Zl)_k, C\theta_k) = 0$$

wherein, with respect to the subject deflector, l is the number of toroidal deflector coils; m is the number of saddle deflector coils; n is the number of compound saddle deflector coils; $JT_i$, $JS_j$, and $JC_k$ are the Ampere-Turn values of the toroidal deflector coil(s), saddle deflector coil(s), and compound saddle deflector coil(s), respectively; $T(R1)_i$ and $T(R2)_i$ are the inside radius and outside radius, respectively, of the toroidal deflector coil(s); $T(Zl)_i$ is the length along the optical axis of each toroidal deflector coil; $T\theta_i$ is the semi-angle of each toroidal deflector coil; $SR_j$ is the radius of each saddle deflector coil; $S(Zl)_j$ is the length along the optical axis of each saddle deflector coil; $S\theta_j$ is the semi-angle of each saddle deflector coil; $C(R1)_k$ and $C(R2)_k$ are the inside radius and outside radius, respectively, of each compound saddle deflector coil; $C(Zl)_k$ is the length along the optical axis of each compound saddle deflector coil; and $C\theta_k$ is the semi-angle of each compound saddle deflector coil. Also, $I_{OT3}(R1,R2,Zl\theta)$ is the index function for the toroidal deflector coil, which (where R1 is the inside radius, R2 is the outside radius, Zl is the length along the optical axis, and $\theta$ is the semi-angle) is expressed as:

$$I_{OT3}(R1, R2, Zl, \theta) = \qquad (2)$$

$$\frac{\pi}{NI} \int_{-\infty}^{\infty} Td_3(z, R1, R2, Zl, \theta) dz = \left[ \frac{2}{3(R1)^3} - \frac{2}{3(R2)^3} \right] (Zl) \sin 3\theta$$

wherein N is the number of coil windings, I is the excitation current applied to the coil windings, and $Td_3(z,R1,R2,Zl,\theta)$ is defined herein (see Equation (16)). In Equation (2), $I_{OS3}(R1,Zl,\theta)$ is the index function for the saddle deflector coil, which (where R1 is the radius, Zl is the length along the optical axis, and $\theta$ is the semi-angle) is expressed as:

$$I_{OS3}(R, Zl, \theta) = \frac{\pi}{NI} \int_{-\infty}^{\infty} Sd_3(z, R, Zl, \theta) dz = \frac{2(Zl)\sin 3\theta}{3R^3} \qquad (3)$$

wherein $Sd_3(z,R,Zl,\theta)$ is defined herein (see Equation (17)), and $I_{OC3}(R1,R2,Zl,\theta)$ is the index function for the compound saddle deflector coil, which is expressed as:

$$I_{OC3}(R1, R2, Zl, \theta) = I_{OT3}(R1, R2, Zl, \theta) + I_{OS3}(R2, Zl, \theta) = \frac{2(Zl)\sin 3\theta}{3(R1)^3} \qquad (4)$$

wherein R1 is the inside radius, R2 is the outside radius, Zl is the length along the optical axis, and $\theta$ is the semi-angle.

In Equation (1) the $\cos[3\phi]$ component is zero. Under such conditions, four-fold aberrations are suppressed by having the Ampere-Turn value in each deflector coil fulfill Equation (1). The more deflectors that satisfy Equation (1), the better. In an optimal configuration, all of the deflectors fulfill Equation (1). However, the skilled person would be able to determine the least number of deflectors that shall fulfill Equation (1), according to the design precision demanded by the CPB exposure apparatus in which the deflector is used.

In at least one deflector other than the deflectors meeting none of the following three conditions, the semi-angle of each respective deflector coil is established such that the Ampere-Turn value for each deflector coil in the deflector is an integer ratio of one another:

(1) a toroidal deflector coil having identical inside radius, outside radius, and length along the optical axis as all of the deflector coils in the deflector;

(2) a saddle deflector coil having identical radius and length along the optical axis in common with all of the deflector coils in a deflector;

(3) a compound saddle deflector coil having identical inside radius, outside radius, and length along the optical axis in common with all of the deflector coils in the deflector.

As noted above, the semi-angle of each deflector coil is determined such that the Ampere-Turn values of the constituent deflector coils are integer ratios (or nearly integer ratios) of each other. As long as the respective numbers of windings in the deflector coils correspond to the respective integers in the ratio, the deflector coils can be driven at the same current, allowing a single coil driver to be used and costs to be reduced.

Similarly, in a deflector having multiple deflector coils including a saddle deflector coil or a modified saddle deflector coil, the radius of the saddle deflector coil, or the distance from the optical axis of the modified saddle deflector coil, can be set such that the respective Ampere-Turn values for the constituent deflector coils are an integer ratio, or nearly an integer ratio, of each other. Further similarly, in a deflector having multiple deflector coils wherein at least one deflector coil is a toroidal deflector coil, the inside radius or outside radius of the toroidal deflector coil can be set such that the Ampere-Turn values of the constituent deflector coils are integer ratios (or nearly integer ratios) of each other. Yet further similarly, in a deflector having multiple deflector coils wherein at least one deflector coil is a compound saddle deflector coil or a modified compound saddle deflector coil, the inside radius or outside radius of the compound saddle deflector coil or modified compound saddle deflector coil can be set such that the Ampere-Turn values of the constituent deflector coils are integer ratios (or nearly integer ratios) of each other.

In at least one deflector, of the deflectors having two or more independent deflector coils, the excitation current applied to each constituent deflector coil can be set to a level that inhibits four-fold aberrations. With such a configuration, a charged particle beam can be obtained that exhibits minimal deflection aberrations. If such a deflector is located downstream of a scattering aperture in the CPB optical system, then the excitation current can be set to a level that inhibits four-fold blur aberration. More specifically, four-fold aberrations are effectively suppressed, by decreasing the cos[3φ] component, with such deflectors located closer to the sensitive substrate than the scattering aperture.

In addition, with such deflectors located downstream of the scattering aperture, the excitation current applied to the deflector can be set to a level that inhibits four-fold coma aberration. More specifically, four-fold coma aberrations are effectively corrected, by decreasing the cos[3φ] component, with such deflectors located closer to the sensitive substrate than the scattering aperture.

In addition, with such deflectors located downstream of the scattering aperture, the excitation current applied to the deflector can be set to a level that inhibits four-fold distortion aberration. As will be explained below, when adjustments are made to suppress four-fold distortion in deflectors closer to the mask plane than the scattering-aperture position, four-fold distortion can be diminished without substantially changing four-fold blur.

The excitation current applied to each deflector coil can be set to a level that inhibits four-fold aberration without substantially changing the deflection sensitivity of the deflector. Since the deflection sensitivity of a deflector is virtually unchanged by the excitation current passed through the various deflector coils to suppress four-fold aberrations, it is unnecessary to perform any new correction to the magnitude of the deflection. The excitation current can be set such that it satisfies (or nearly satisfies) Equation (5), below:

$$\sum_{i=1}^{l} JT_i \cdot I_{OT1}(T(R1)_i, T(R2)_i, T(Zl)_i, T\theta_i) + \sum_{j=1}^{m} JS_j \cdot I_{OS1}(SR_j, S(Zl)_j, S\theta_j) + \sum_{k=1}^{n} JC_k \cdot I_{OC1}(C(R1)_k, C(R2)_k, C(Zl)_k, C\theta_k) = Const. \quad (5)$$

wherein, with respect to the deflector, l is the number of toroidal deflector coils; m is the number of saddle deflector coils; n is the number of compound saddle deflector coils; $JT_i$, $JS_j$, and $JC_k$ are the Ampere-Turn values of the toroidal deflector coil(s), saddle deflector coil(s), and compound saddle deflector coil(s), respectively; $T(R1)_i$ and $T(R2)_i$ are the inside radius and outside radius, respectively, of the toroidal deflector coil(s); T(Zl) is the length along the optical axis of each toroidal deflector coil; $T\theta_i$ is the semi-angle of each toroidal deflector coil; $SR_j$ is the radius of each saddle deflector coil; $S(Zl)_j$ is the length along the optical axis of each saddle deflector coil; $S\theta_j$ is the semi-angle of each saddle deflector coil; $C(R1)_k$ and $C(R2)_k$ are the inside radius and outside radius, respectively, of each compound saddle deflector coil; $C(Zl)_k$ is the length along the optical axis of each compound saddle deflector coil; and $C\theta_k$ is the semi-angle of each compound saddle deflector coil. In addition, $I_{OT1}(R1,R2,Zl,\theta)$ is the index function for the toroidal deflector coil (where R1 is the inside radius, R2 is the outside radius, Zl is the length along the optical axis, and θ is the semi-angle) which is expressed as:

$$I_{OT1}(R1, R2, Zl, \theta) = \frac{\pi}{NI} \int_{-\infty}^{\infty} Td_1(z, R1, R2, Zl, \theta) dz = \left[\frac{2}{(R1)} - \frac{2}{(R2)}\right](Zl)\sin\theta \quad (6)$$

wherein $Td_1(z,R1,R2,Zl,\theta)$ is defined herein (see Equation (13)) and $I_{OS1}(R1,Zl,\theta)$ is the index function for the saddle deflector coil which is expressed as:

$$I_{OS1}(R, Zl, \theta) = \frac{\pi}{NI} \int_{-\infty}^{\infty} Sd_1(z, R, Zl, \theta) dz = \frac{2(Zl)\sin\theta}{R} \quad (7)$$

wherein $Sd_1(R1,R2,Zl,\theta)$ is defined herein (see Equation (13)) and $I_{OC1}(R1,R2,Zl,\theta)$ is the index function for the compound saddle deflector coil which is expressed as:

$$I_{OC1}(R1, R2, Zl, \theta) = I_{OT1}(R1, R2, Zl, \theta) + I_{OS3}(R2, Zl, \theta) = \frac{2(Zl)\sin\theta}{R1} \quad (8)$$

wherein $I_{OS3}(R2,Zl,\theta)$ is defined by Equation (3). Thus, the excitation current for each deflector coil can be set to a level that suppresses four-fold aberrations without changing the deflection sensitivity of the deflector.

In a deflector having two or more independent deflector coils, the excitation current applied to each deflector coil can be set to a level that inhibits four-fold aberration without substantially changing the higher-order aberration of the deflector. With such a configuration, new aberrations are not generated because the higher-order aberrations in the deflector are virtually unchanged, even if the excitation current of each deflector coil is changed to suppress four-fold aberrations. The excitation current is desirably set such that it satisfies (or nearly satisfies) Equation (9), below:

$$\sum_{i=1}^{l} JT_i \cdot I_{OTS}(T(R1)_i, T(R2)_i, T(Zl)_i, T\theta_i) + \quad (9)$$

$$\sum_{j=1}^{m} JS_j \cdot I_{OSS}(SR_j, S(Zl)_j, S\theta_j) +$$

$$\sum_{k=1}^{n} JC_k \cdot I_{OCS}(C(R1)_k, C(R2)_k, C(Zl)_k, C\theta_k) = 0$$

wherein $l$, m, n, $JT_i$, $JS_j$, $JC_k$, $T(R1)_i$, $T(R2)_i$, $T(Zl)_i$, $T\theta_i$, $SR_j$, $S(Zl)_j$, $S\theta_j$, $C(R1)_k$, $C(R2)_k$, $C(Zl)_k$, and $C\theta_k$ are defined above. Also, $I_{OTS}(R1,R2,Zl,\theta)$ is the index function for the toroidal deflector coil which is expressed as:

$$I_{OTS}(R1, R2, Zl, \theta) = \quad (10)$$

$$\frac{\pi}{NI} \int_{-\infty}^{\infty} Td_5(z, R1, R2, Zl, \theta) dz = \left[\frac{2}{5(R1)^5} - \frac{2}{5(R2)^5}\right](Zl)\sin5\theta$$

wherein $Td_5(z,R1,R2,Zl,\theta)$ is defined herein (see Equation (19)) and $I_{OSS}(R1,Zl,\theta)$ is the index function for the saddle deflector coil which is expressed as:

$$I_{OSS}(R, Zl, \theta) = \frac{\pi}{NI} \int_{-\infty}^{\infty} Sd_5(z, R, Zl, \theta) dz = \frac{2(Zl)\sin5\theta}{5R^5} \quad (11)$$

wherein $Sd_5(z,R,Zl,\theta)$ is defined herein (see Equation (20)) and $I_{OC1}(R1,R2,Zl,\theta)$ is the index function for the compound saddle deflector coil which is expressed as:

$$I_{OCS}(R1, R2, Zl, \theta) = \quad (12)$$

$$I_{OTS}(R1, R2, Zl, \theta) + I_{OSS}(R2, Zl, \theta) = \frac{2(Zl)\sin5\theta}{5(R1)^5}$$

With such a configuration, the excitation current applied to each deflector coil can be set to a level that will suppress four-fold aberrations, virtually without changing the higher-order aberrations in the deflector.

The foregoing and other features and advantages of the invention will be more readily apparent from the following detailed description, which proceeds with reference to the accompanying drawings.

BRIEF DESCRIPTION OF THE DRAWINGS

FIGS. 2(A)–2(C) depicts various aspects of a toroidal deflector coil as used in Comparison Example 1.

FIGS. 3(A)–3(C) depict various aspects of a saddle deflector coil as used in Comparison Example 3.

FIGS. 4(A)–4(C) depict various aspects of a compound saddle deflector coil as used in Example Embodiment 1.

FIGS. 5(A)–5(C) depict various aspects of an inner compound saddle deflector coil as used in Example Embodiment 2.

FIGS. 7(A)–7(C) depict various aspects of a deflector combining a toroidal deflector coil and a compound saddle deflector coil as used in Example Embodiment 3.

FIG. 8 is a graph of the cos[3φ] component of a magnetic field produced by the deflector of FIGS. 7(A)–7(C).

FIGS. 9(A)–(C) depict various aspects of a deflector combining a toroidal deflector coil and a modified compound saddle deflector coil as used in Example Embodiment 4.

FIGS. 10(A)–(C) depict various aspects of a deflector combining two toroidal deflector coils and one compound saddle deflector coil as used in Example Embodiment 5.

FIGS. 11(A)–11(C) depict various aspects of a deflector combining a saddle deflector coil and a saddle deflector coil as used in Example Embodiment 6.

FIG. 14 illustrates a conventional manner in which exposure units of a divided reticle are projection-transferred to the substrate.

FIG. 16 is a process flowchart for performing a microlithography method that includes a projection-exposure method according to the invention.

DETAILED DESCRIPTION OF EXAMPLE EMBODIMENTS

Figure 1:
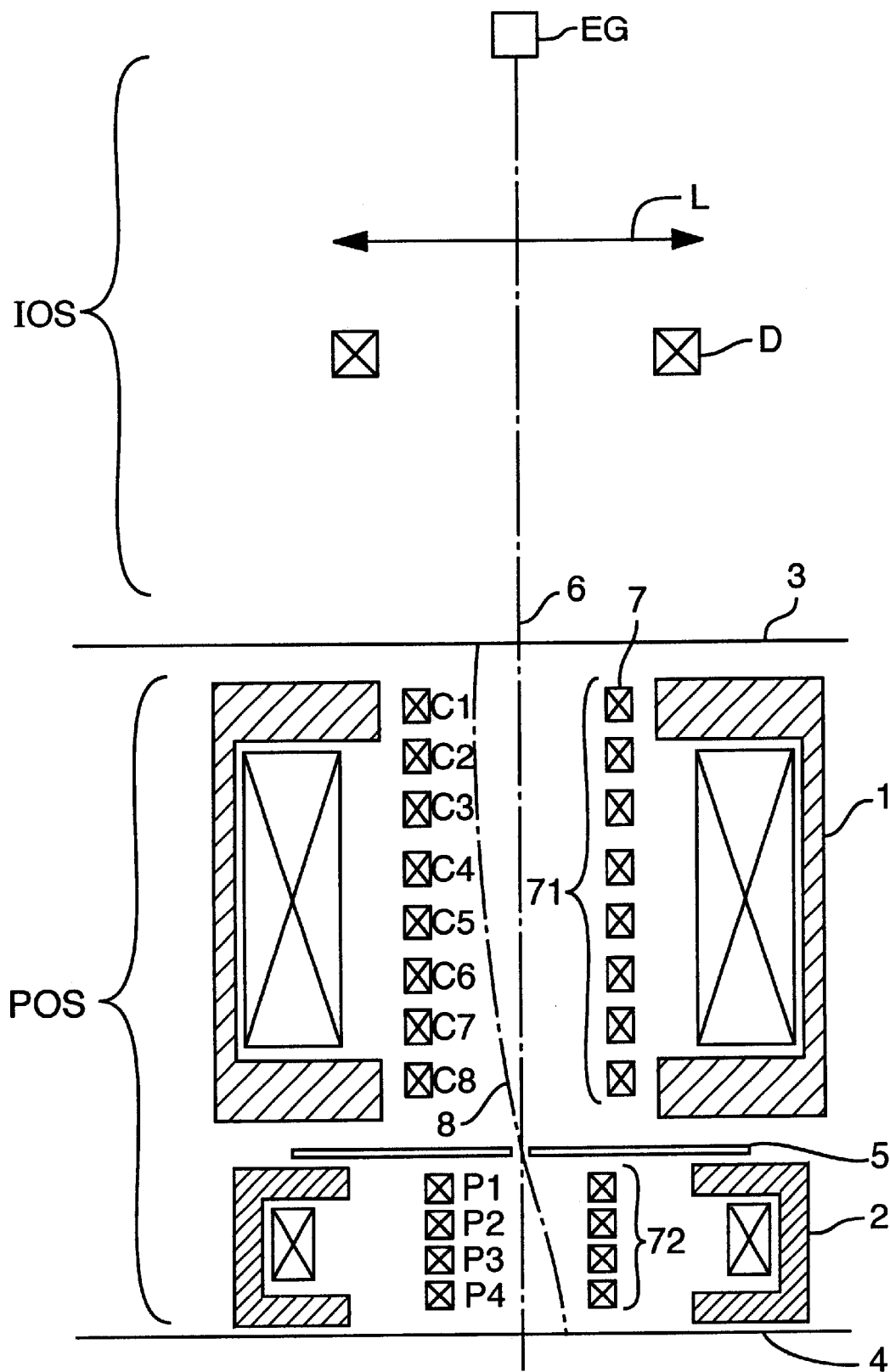
FIG. 1 is an elevational schematic optical diagram of a projection-optical system of a representative embodiment of an electron-beam microlithography projection-exposure apparatus according to the invention.

A first representative embodiment of an electron-beam (as a representative charged particle beam) microlithography apparatus according to the invention is shown in FIG. 1, which details various aspects of the projection-optical system POS of the apparatus, located between the reticle 3 and the substrate 4 (e.g., semiconductor wafer).

FIG. 1 also outlines the illumination-optical system IOS located between an electron gun EG and the reticle 3. The illumination optical system IOS includes at least one lens L and at least one deflector D. The illumination-optical system IOS and projection-optical system collectively constitute the charged-particle-beam (CPB) optical system. Downstream of the reticle 3 along an optical axis 6 are a first projection lens 1 and a second projection lens 2. Between the first and second lenses is a scattering aperture 5 defining an opening located on the optical axis 6.

An electron beam 8 passing through an illuminated region of the reticle 3 passes through the opening in the scattering aperture 5. Items 71 and 72 are deflector sets each comprising multiple deflectors.

The reticle 3 is illuminated by an "illumination beam" passing from the electron gun EG through the illumination-optical system IOS. An image of the illuminated region on the reticle 3 is formed on the substrate 4 by the first and second projection lenses 1, 2 functioning in concert as the projection-optical system POS. The image formed on the substrate 4 is "demagnified" by which is meant that the image on the substrate is smaller (usually by a "demagnification factor" such as ¼ or ⅕) than the corresponding illuminated region on the reticle 3. The scattering aperture 5 blocks scattered electrons propagating from the reticle 3. The deflector set 71 comprises eight deflectors C1–C8 disposed upstream of the scattering aperture 5. The deflector set 72 comprises four deflectors P1–P4 disposed downstream of the scattering aperture 5. The deflector sets 71, 72 deflect the electron beam 8 propagating downstream of an illuminated region of the reticle 3 long a desired trajectory in which the electron beam 8 passes through the opening in the scattering aperture 5. The deflector sets also function, as described in detail below, to eliminate distortion and aberrations in the image as formed on the substrate 4.

By way of example, the FIG.-1 embodiment has a demagnification ratio of ¼. The axial distance between the reticle 3 and the substrate 4 is 600 mm. The excitation current applied to the lenses 1, 2 is sufficient to form, from the illuminated region on the reticle 3, an image measuring 0.25 mm square on the substrate 4. In the examples described below, performance of the deflectors in the deflector sets 71, 72 at particular respective currents applied to the deflectors is evaluated by determining the amount of blur and distortion produced in an image on the substrate whenever the illuminated region on the reticle produced an image located 2.5 mm from the optical axis 6 and the beam exhibited a 6 mrad aperture angle.

Comparison Example 1

In this comparison example, each of the deflectors C1–C8 and P1–P4 is a toroidal deflector coil as conventionally used. The general profile of each of the toroidal deflector coils is shown in FIGS. 2(A) and 2(B), wherein FIG. 2(B) is an end view (z-axis view) of FIG. 2(A). The indicated dimensions of (Z2–Z1), R1, R2, and θ are listed in FIG. 2(C). Note that Z1 and Z2 are respective locations on the z-axis.

COMPARISON EXAMPLE 2

In this comparison example, each of the deflectors C1–C8 and P1–P4 is a saddle deflector coil as conventionally used. The general profile of each of the saddle deflector coils is shown in FIGS. 3(A) and 3(B), wherein FIG. 3(B) is a z-axial view of FIG. 3(A). The indicated dimensions of (Z2–Z1), R, and θ are listed in FIG. 3(C).

COMPARISON EXAMPLE 3

In this comparison example, each of the deflectors C1–C8 and P1–P4 is a saddle deflector coil, as in Comparison Example 2, but the dimensions (Z2–Z1), R, and θ are changed from the values shown in FIG. 3(C). Specifically, in this comparison example, (Z2–Z1)=45 mm, R=74 mm, and θ=60° for deflectors C1–C8, and (Z2–Z1)=27 mm, R=47 mm, and θ=60° for deflectors P1–P4.

EXAMPLE EMBODIMENT 1

In this example embodiment, each of the deflectors C1–C8 and P1–P4 is configured as a "compound saddle deflector coil" having a general profile as shown in FIGS. 4(A)–4(B), wherein FIG. 4(B) is a z-axial view of FIG. 2(A). Representative dimensions of (Z2–Z1), R1, R2, and θ are listed in FIG. 4(C).

EXAMPLE EMBODIMENT 2

In this example embodiment, each of the deflectors C1–C8 and P1–P4 is configured as an "inner compound saddle deflector coil" having a general profile as shown in FIGS. 5(A)–5(B), wherein FIG. 5(B) is a z-axial view of FIG. 5(A). Representative dimensions of (Z2–Z1), R1, R2, and θ are listed in FIG. 5(C).

For comparison purposes, representative operational results of Comparison Examples 1–3 and Example Embodiments 1–2 are listed in Table 1.

TABLE 1

|  | Example Embod 1 | Example Embod 2 | Example Embod 3 | Example Embod 4 | Example Embod 5 | Comparison Example 1 | Comparison Example 2 | Comparison Example 3 |
|---|---|---|---|---|---|---|---|---|
| Image Aberration (nm) | | | | | | | | |
| Blur | 87.8 | 88.0 | 85.0 | 88.4 | 88.8 | 90.4 | 133.2 | 82.5 |
| Distortion | 4.8 | 7.6 | 4.6 | 3.9 | 4.5 | 4.2 | 8.7 | 6.3 |
| Four-fold aberration (nm) | | | | | | | | |
| Blur | | | 10.0 | 16.7 | 5.7 | | | |
| Distortion | | | 0.5 | 4.2 | 0.3 | | | |
| Deflector Current (A-Turns) | | | | | | | | |
| C1 | 27.0 | 9.4 | 22.9 | 25.0 | 19.0 | 47.1 | 11.7 | 37.6 |
| C2 | 8.0 | 8.1 | 12.5 | 15.1 | 12.2 | 24.8 | 11.4 | 15.7 |
| C3 | 11.5 | 6.1 | 12.9 | 14.4 | 10.8 | 25.0 | 8.7 | 22.0 |
| C4 | 13.4 | 6.9 | 12.8 | 14.5 | 11.3 | 23.9 | 10.7 | 25.5 |
| C5 | 14.2 | 11.6 | 16.4 | 19.6 | 16.9 | 31.6 | 18.0 | 28.5 |
| C6 | 38.2 | 18.9 | 40.1 | 44.7 | 36.8 | 77.4 | 27.7 | 67.7 |
| C7 | 22.6 | 16.5 | 25.2 | 28.8 | 25.0 | 49.5 | 25.1 | 40.6 |

TABLE 1-continued

|  | Example Embod 1 | Example Embod 2 | Example Embod 3 | Example Embod 4 | Example Embod 5 | Comparison Example 1 | Comparison Example 2 | Comparison Example 3 |
|---|---|---|---|---|---|---|---|---|
| C8 | −37.6 | −19.5 | 40.7 | 46.5 | −38.9 | −78.7 | 27.6 | −68.2 |
| P1 | 24.8 | 4.4 | 24.4 | 23.4 | 20.5 | 46.2 | −4.1 | 46.2 |
| P2 | −79.6 | −38.1 | 86.4 | 92.8 | −86.6 | −168.2 | −52.2 | −167.6 |
| P3 | −73.5 | −22.4 | 55.3 | 56.9 | −53.1 | −103.1 | −34.4 | −114.1 |
| P4 | −82.9 | −30.3 | 79.6 | 80.9 | −85.0 | −150.0 | −42.7 | −157.5 |
| Average | 36.1 | 16.0 | 35.9 | 36.6 | 34.7 | 68.8 | 22.8 | 65.9 |

Figure 6:
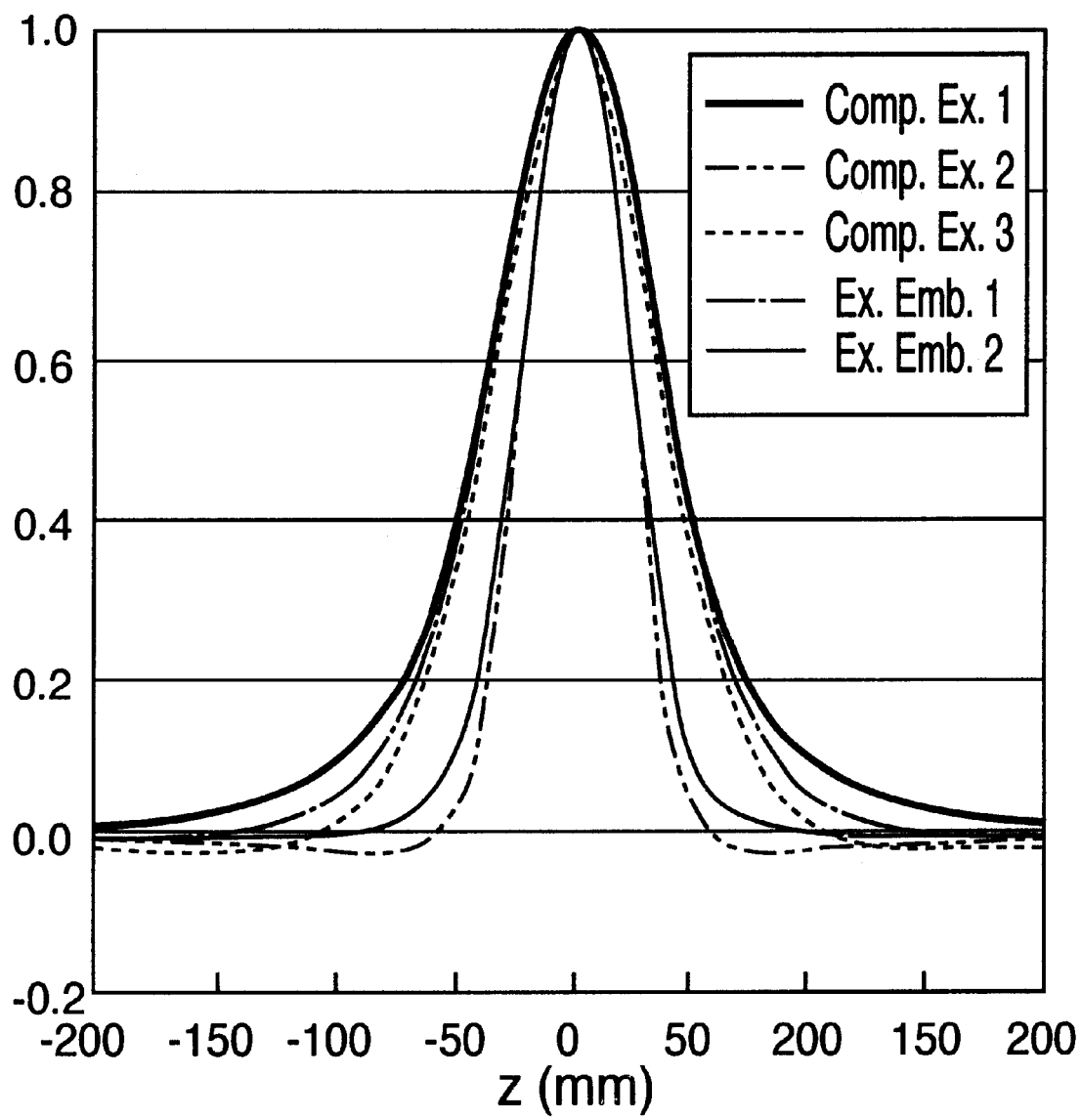
FIG. 6 provides graphs of the respective deflection fields produced by the deflector coils used in the comparison examples and in certain of the example embodiments.

In Comparison Example 1, at the stated deflector currents (Ampere-Turns) applied to the respective deflectors, overall image blur was 90 nm and overall image distortion was 4.2 nm. In contrast, in Comparison Example 2, the stated deflector currents applied to the respective deflectors were, on average, ⅓ the corresponding currents applied in Comparison Example 1. Nevertheless, with Comparison Example 2, overall image blur was approximately 1.5 times greater and image distortion was approximately 2 times greater than respective values obtained with Comparison Example 1. Such worsening of image aberrations in Comparison Example 2 compared to Comparison Example 1 was attributed to the narrower width (along the z-axis) of the deflection field (normalized to the maximum deflection-field magnitude) created by the deflectors of Comparative Example 2 relative to the deflectors of Comparative Example 1, as shown in FIG. 6. (The ordinate of FIG. 6 is magnetic flux density, and the curves are normalized to their respective maxima.) As a result, the deflection field produced by Comparison Example 2 had a markedly irregular profile compared to the deflection field produced by Comparative Example 1, which adversely affected image aberrations produced by Comparative Example 2.

In Comparison Example 3, image blur was 90% of what was observed in Comparison Example 1, and image distortion was 1.5 times greater than observed in Comparison Example 1. The magnitudes of electrical currents (Ampere-Turns) applied to the deflectors in Comparison Example 3 were, on average, about the same as in Comparison Example 1, but higher than in Comparison Example 2. The image aberrations seen in Comparison Example 3, especially in view of the average deflector currents, were too excessive for satisfactory performance.

Whereas image blur and image distortion observed in Example Embodiment 1 were nearly equal to the respective aberrations observed in Comparison Example 1, the average current applied to the deflector coils of Example Embodiment 1 was half the average current applied to the deflector coils of Comparison Example 1. The width of the deflection field (FIG. 6) produced by Example Embodiment 1 was nearly the same as the width of the deflection field produced by the Comparative Example 1, and significantly wider than the deflection field produced by Comparison Example 2. Also, whereas image distortion produced by Example Embodiment 2 was increased relative to Comparison Example 1, image blur in both was substantially identical. However, the current applied to the deflector coils of Example Embodiment 2 was, on average, less than ¼ of the current applied to the deflector coils of Comparison Example 1.

EXAMPLE EMBODIMENT 3

In this example embodiment, each of the deflectors C1–C8 and P1–P4 is configured as a combined toroidal deflector coil and a compound saddle deflector coil, having a general profile as shown in FIGS. 7(A)–7(B). Generally, deflector coils include coils for each of the two directions, X and Y. FIG. 7(A) shows only coils that generate a magnetic field directed to the X-axis. In FIG. 7(B), such coils are denoted by solid lines and the coils that generate a magnetic field directed to the Y-axis are denoted by dashed lines. In FIG. 7(A), dashed lines are additional lines used for measuring the size or angles of coils. The indicated dimensions of (Z2−Z1), R1, and R2 are listed in FIG. 7(C), and the set value of θ for each coil is denoted in FIG. 7(A).

Magnetic field components proportional to $\sin[5\theta]$ have zero magnitude whenever deflector coils are combined that have semi-angles θ of 36° and 72°. As a result, higher-order aberrations that would otherwise arise from magnetic-field components are effectively suppressed. As listed in Table 1, whereas image blur and distortion in Example Embodiment 3 are substantially identical to the image blur and distortion, respectively, observed in Comparison Example 1, the current applied to the deflector coils in Example Embodiment 3 is, on average, half the current applied to the deflector coils in Comparison Example 1. This result is illustrated in FIG. 8, in which the abscissa is distance along the optical axis (i.e., distance along the z-axis), "O" is the center of the deflector, and the ordinate is the component of the magnetic field that is proportional to $\cos[3\theta]$. In FIG. 8, (i) denotes the magnetic-field component generated by the toroidal deflector coil, (ii) denotes the magnetic-field component generated by the compound saddle deflector coil, and (iii) denotes the sum of (i) and (ii). As can be seen in FIG. 8, the $\cos[3\phi]$ component generated by the toroidal deflector coil and the $\cos[3\phi]$ component generated by the compound saddle deflector coil cancel each other out so that the net $\cos[3\phi]$ component is essentially zero. Under such conditions, image blur and distortion are greatly reduced.

EXAMPLE EMBODIMENT 4

In this example embodiment, each of the deflectors C1–C8 and P1–P4 is configured as shown in FIGS. 9(A)–9(B). FIG. 9(A) shows only coils that generate a magnetic field directed to the X-axis. In FIG. 9(B), such coils are denoted by solid lines and the coils that generate a magnetic field directed to the Y-axis are denoted by dashed lines. In FIG. 9(A), dashed lines are additional lines used for measuring the size or angles of coils. The indicated dimensions of (Z2−Z1), R1, R2, and R3 are listed in FIG. 9(C), and the set value of θ for each coil is denoted in FIG. 9(A). The deflector of this working example includes a modified compound saddle deflector coil in which the curved surfaces of the compound saddle deflector coil of FIG. 7(A) are replaced with flat surfaces residing in respective planes that do not intersect the optical axis. Thus, this deflector includes a modified compound saddle coil (θ=36°) and a toroidal coil (θ=72°). Whereas blur and distortion due to four-fold aberrations are increased with the FIG.-9(A) configuration compared to the FIG.-7(A) configuration, the difference in four-fold aberrations between these two configurations is not substantial, as indicated by the data in Table 1. Moreover, due to its simple shape, the deflector of this example embodiment can be fabricated with high precision, making it possible to minimize unexpected increases in aberrations due to assembly errors.

EXAMPLE EMBODIMENT 5

Figure 10C:
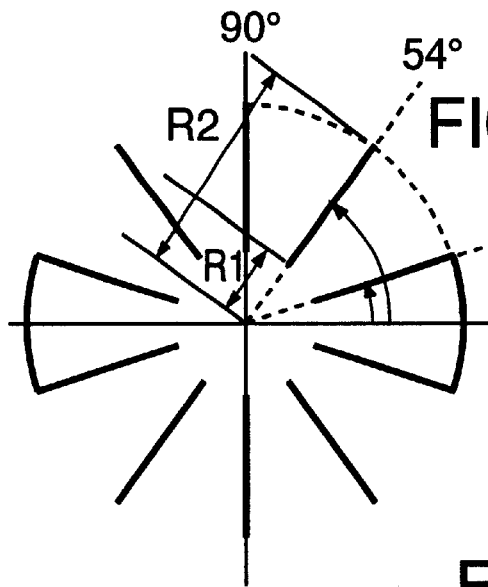
Figure 10C:
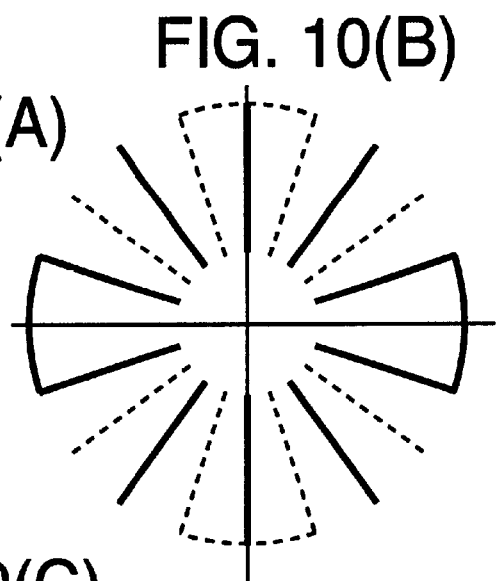

In this example embodiment, each of the deflectors C1–C8 and P1–P4 is configured as shown in FIGS. 10(A)–10(B). FIG. 10(A) shows only coils that generate a magnetic field directed to the X-axis. In FIG. 10(B), such coils are denoted by solid lines and the coils that generate a magnetic field directed to the Y-axis are denoted by dashed lines. In FIG. 10(A), dashed lines are additional lines used for measuring the size or angles of coils. The indicated dimensions of Z2–Z1), R1, and R2 are listed in FIG. 10(C), and the set value of θ for each coil is denoted in FIG. 10(A). The deflector of this example embodiment is a combination of a toroidal deflector coil and a compound saddle deflector coil. Each of the deflector coils shown in FIGS. 10(A)–10(B) is configured to suppress components proportional to cos[3φ] and cos[5φ] by combining one compound saddle deflector coil having a semi-angle of 18° with a toroidal deflector coil having respective semi-angles of 54° and 90°. In each deflector coil, it is difficult for cos[5φ] components to arise even if the semi-angle settings for each coil vary from the design values. Even at five times the semi-angles (18°, 54°, and 90°) for each coil (i.e., 5θ), the magnetic field is stable to errors. This is because the integral value for θ of the respective magnetic-field components (i.e., the value of cos[5θ]) is zero for each semi-angle).

EXAMPLE EMBODIMENT 6

Figure 11C:
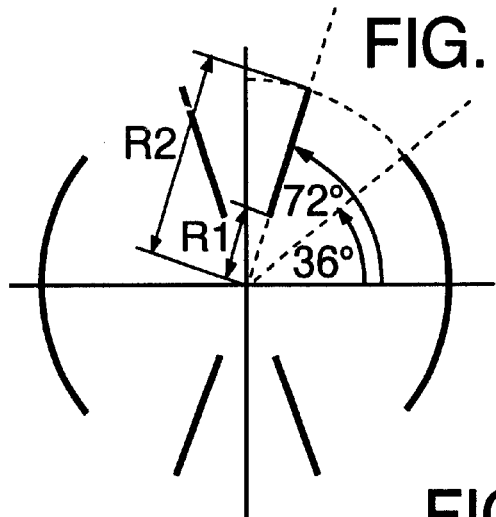
Figure 11C:
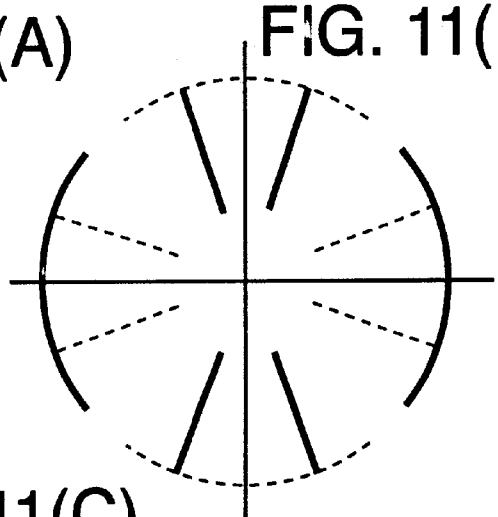

In each of Example Embodiments 1–5 described above, compound saddle deflector coils were used. However, in Example Embodiments 3–5, similar effects could have been realized if saddle deflector coils were used instead of the compound saddle deflector coils. For example, in Example Embodiment 6, a combination of a toroidal deflector coil and a saddle deflector coil is used, having a configuration as shown in FIGS. 11(A)–11(B), instead of the configuration used in Example Embodiment 3. FIG. 11(A) shows only coils that generate a magnetic field directed to the X-axis. In FIG. 11(B), such coils are denoted by solid lines and the coils that generate a magnetic field directed to the Y-axis are denoted by dashed lines. In FIG. 11(A), dashed lines are additional lines used for measuring the size or angles of coils. For Example Embodiment 6, the indicated dimensions of Z2–Z1), R1, and R2 are listed in FIG. 11(C), and the set value of e for each coil is denoted in FIG. 11(A).

Whenever a saddle deflector coil or compound saddle deflector coil is used in combination with a toroidal deflector coil, it is preferable for the semi-angle of the saddle deflector coil or compound saddle deflector coil to be 45° or less. Under such conditions, the X-axis deflector coils (indicated by the solid lines) and the Y-axis deflector coils (indicated by the dashed lines) can be disposed at the same axial position (i.e., same position along the optical axis). Such a configuration allows the overall size of the microlithography apparatus to be reduced and beam-deflection control to be simplified.

Reducing aberrations in cases where, in a deflector according to the invention, coils are combined such that the x-axis deflector coils and the y-axis deflector coils have the same axial position (i.e., the same position on the z-axis or optical axis) but the semi-angles θ of the coils are different are theoretically considered below. Actual examples are described as appropriate.

First, a configuration is considered in which a deflector comprises a combination of several of the same types of deflector coils (e.g., a toroidal coil and a toroidal coil, or a saddle coil and a saddle coil). The only difference in the coils is the semi-angle of each respective coil. In such a configuration, the cos[φ] component, the cos[3φ] component, and the cos[5φ] component produced by the coils at a measurement point ((z,r,φ)); expressed using a cylindrical coordinate system that is coaxial with the deflector, wherein z=0 at the center of the deflector) for the magnetic field created by a coil are (as shown in Munro and Chu, Optik 60:371–390, 1982) expressed as follows:

Cos[φ] component:

$$Td_1(z, R1, R2, Zl, \theta) = \frac{NI}{\pi}\sin\theta \int_{R1}^{R2}\int_{-Zl/2}^{Zl/2}\frac{dR\,dZ}{L^3} \quad (13)$$

$$Sd_1(z, R, Zl, \theta) = \frac{NI}{\pi}\sin\theta \int_{-Zl/2}^{Zl/2}\frac{R}{L^3}\left[\frac{3R^2}{L^2}-1\right]dZ \quad (14)$$

$$Cd_1(z,R1,R2,Zl,\theta)=Td_1(z,R1,R2,Zl,\theta)+Sd_1(z,R2,Zl,\theta) \quad (15)$$

Cos[3φ] component:

$$Td_3(z, R1, R2, Zl, \theta) = \frac{15NI}{8\pi}\sin 3\theta \int_{R1}^{R2}\int_{-Zl/2}^{Zl/2}\frac{R^2\,dR\,dZ}{L^7} \quad (16)$$

$$Sd_3(z, R, Zl, \theta) = \frac{NI}{\pi}\sin 3\theta \int_{-Zl/2}^{Zl/2}\frac{R^3}{L^7}\left[\frac{35R^2}{24L^2}-\frac{5}{8}\right]dZ \quad (17)$$

$$Cd_3(z,R1,R2,Zl,\theta)=Td_3(z,R1,R2,Zl,\theta)+Sd_3(z,R2,Zl,\theta) \quad (18)$$

Cos[5φ] component:

$$Td_5(z, R1, R2, Zl, \theta) = \frac{315NI}{128\pi}\sin 5\theta \int_{R1}^{R2}\int_{-Zl/2}^{Zl/2}\frac{R^4\,dR\,dZ}{L^{11}} \quad (19)$$

$$Sd_5(z, R, Zl, \theta) = \frac{NI}{\pi}\sin 5\theta \int_{-Zl/2}^{Zl/2}\frac{R^5}{L^{11}}\left[\frac{693R^2}{640L^2}-\frac{63}{128}\right]dZ \quad (20)$$

$$Cd_5(z,R1,R2,Zl,\theta)=Td_5(z,R1,R2,Zl,\theta)+Sd_5(z,R2,Zl,\theta) \quad (21)$$

wherein the semi-angle of each respective coil is θ. In the expressions above, $Td_i$ (i=1, 3, 5) denotes the cos[iφ] component of a toroidal coil; $Sd_i$ denotes the cos[iφ] component of a saddle coil; and $Cd_i$ denotes the cos[iφ] component of a compound saddle coil; z is the coordinate along the optical axis; R1 and R2 are the inside radius and outside radius, respectively, of the saddle coil (or compound saddle coil); R is the outside radius of the saddle coil; Zl is the coil length; N is the number of coil windings; I is the excitation current; and L is the distance between a point $P_0$ (z,0,0) on the optical axis having the same z coordinate as the measurement point (z,r,φ) in the magnetic field and a random point Q (having coordinates (X,Y,Z) in an orthogonal coordinate system, or (Z,R,θ) in a cylindrical coordinate system) on the contour surface S that is wrapped with the coil wire. L is calculated as $L=(R^2+(z-Z)^2)^{1/2}=(X^2+Y^2+(z-Z)^2)^{1/2}$.

The cos[3φ] component is proportional to sin[3φ]. (The same is true for a compound saddle coil, but since a compound saddle coil is essentially the sum of a toroidal coil and a saddle coil, discussion of this proportionality in connection with a compound saddle coil is omitted here.) Therefore, in a conventional deflector in which multiple deflector coils of the same type are combined such that only the respective semi-angles of the coils are different (e.g., combination of a toroidal coil and a toroidal coil), the $\cos[3\phi]$ component of the magnetic field produced by the deflector can be adjusted to zero by setting the ratio of respective excitation currents applied to the coils such that their $\sin[3\phi]$ values cancel each other out. For instance, a deflector made from two saddle coils having identical radii and z lengths, arid whose semi-angles are 36° and 72°, respectively, can produce a $\cos[3\phi]$ component of zero in the magnetic field produced by the coils. This is done by setting the excitation currents of the respective coils according to a ratio such that (current applied to 36° coil):(current applied to 72° coil) $\sin[3\times72°]$:$\sin[3\times36°]$.

In contrast, a deflector according to the present invention comprises multiple deflector coils of different types, such as a toroidal coil and a saddle coil. As a result, the profiles of the $\cos[3\phi]$ components in the magnetic fields generated by the respective coils are not similar. Even if a deflector according to the invention were to be constructed according to conventional practice in which the ratio of currents applied to the coils is such that their $\sin[3\phi]$ ratio simply cancels, the $\cos[3\phi]$ component of the magnetic field produced by the deflector will not be zero.

Therefore, in an adjustment method according to the invention, the $\cos[3\phi]$ component of the magnetic field produced by the deflector is also effectively suppressed, even in deflectors in which deflector coils of different types are combined.

Index equations like those shown below can be obtained by shifting the $\cos[\phi]$ component, the $\cos[3\phi]$ component, and the $\cos[5\phi]$ component of the magnetic field produced by the coil along the z-axis and integrating from infinity to infinity. However, the term $\pi$, the current I, and the number of windings N have been eliminated from the equations.

For the $\cos[\phi]$ component:

$$I_{OT1}(R1, R2, Zl, \theta) = \qquad (6)$$

$$\frac{\pi}{NI}\int_{-\infty}^{\infty} Td_1(z, R1, R2, Zl, \theta)\,dz = \left[\frac{2}{(R1)} - \frac{2}{(R2)}\right](Zl)\sin\theta$$

wherein $Td_1$ is defined by Equation (13).

$$I_{OS1}(R, Zl, \theta) = \frac{\pi}{NI}\int_{-\infty}^{\infty} Sd_1(z, R, Zl, \theta)\,dz = \frac{2(Zl)\sin\theta}{R} \qquad (7)$$

wherein $Sd_1$ is defined by Equation (14).

$$I_{OC1}(R1, R2, Zl, \theta) = I_{OT1}(R1, R2, Zl, \theta) + I_{OS3}(R2, Zl, \theta) = \frac{2(Zl)\sin\theta}{R1} \qquad (8)$$

For the $\cos[3\phi]$ component:

$$I_{OT3}(R1, R2, Zl, \theta) = \qquad (2)$$

$$\frac{\pi}{NI}\int_{-\infty}^{\infty} Td_3(z, R1, R2, Zl, \theta)dz = \left[\frac{2}{3(R1)^3} - \frac{2}{3(R2)^3}\right](Zl)\sin3\theta$$

wherein $Td_3$ is defined by Equation (16).

$$I_{OS3}(R, Zl, \theta) = \frac{\pi}{NI}\int_{-\infty}^{\infty} Sd_3(z, R, Zl, \theta)\,dz = \frac{2(Zl)\sin3\theta}{3R^3} \qquad (3)$$

wherein $Sd_3$ is defined by Equation (17).

$$I_{OC3}(R1, R2, Zl, \theta) = I_{OT3}(R1, R2, Zl, \theta) + I_{OS3}(R2, Zl, \theta) = \frac{2(Zl)\sin3\theta}{3(R1)^3} \qquad (4)$$

For the $\cos[5\phi]$ component:

$$I_{OT5}(R1, R2, Zl, \theta) = \qquad (10)$$

$$\frac{\pi}{NI}\int_{-\infty}^{\infty} Td_5(z, R1, R2, Zl, \theta)\,dz = \left[\frac{2}{5(R1)^5} - \frac{2}{5(R2)^5}\right](Zl)\sin5\theta$$

wherein $Td_5$ is defined by Equation (19).

$$I_{OS5}(R, Zl, \theta) = \frac{\pi}{NI}\int_{-\infty}^{\infty} Sd_5(z, R, Zl, \theta)\,dz = \frac{2(Zl)\sin5\theta}{5R^5} \qquad (11)$$

wherein $Sd_5$ is defined by Equation (20).

$$I_{OC5}(R1, R2, Zl, \theta) = \qquad (12)$$

$$I_{OT5}(R1, R2, Zl, \theta) + I_{OS5}(R2, Zl, \theta) = \frac{2(Zl)\sin5\theta}{5(R1)^5}$$

wherein, $I_{OTi}$ (i=1, 2, 3) denotes the index of the $\cos[i\phi]$ component of a toroidal coil, $I_{OSi}$ denotes the index of the $\cos[i\phi]$ component of a saddle coil, and $I_{OCi}$ denotes the index of the $\cos[i\phi]$ component of a compound saddle coil. All other symbols and variables have the same respective meanings as explained above.

As described in Chu and Munro, *Optik* 61:121–145, 1982, four-fold aberrations include the integral over z of the product of the $\cos[3\phi]$ component of the system's magnetic field $D_3(z)$ and the path w. Accordingly, using the indices for the $\cos[3\phi]$ component provided in Equations (2)–(4), if a ratio of coil current is used that satisfies the following:

$$\sum_{i=1}^{l} JT_i \cdot I_{OT3}(T(R1)_i, T(R2)_i, T(Zl)_i, T\theta_i) + \qquad (1)$$

$$\sum_{j=1}^{m} JS_j \cdot I_{OS3}(SR_j, S(Zl)_j, S\theta_j) +$$

$$\sum_{k=1}^{n} JC_k \cdot I_{OC3}(C(R1)_k, C(R2)_k, C(Zl)_k, C\theta_k) = 0$$

then the $\cos[3\phi]$ component of the magnetic field $D_3(z)$ produced by the deflector can be suppressed and four-fold aberrations can be diminished. In Equation (1), above, p is the number of toroidal deflector coils, m is the number of saddle deflector coils, and n is the number of compound saddle deflector coils in the subject deflector. Also, with respect to the subject deflector, $JT_i$, $JS_j$, and $JC_k$ denote the Ampere-Turn values of the toroidal deflector coil, saddle deflector coil, and compound saddle deflector coil, respectively; $T(R1)_i$ and $T(R2)_i$ are the inside radius and outside radius, respectively, of each toroidal deflector coil; $T(Zl)_i$ is the length along the optical axis of each toroidal deflector coil; $T\phi_i$ is the semi-angle of each toroidal deflector coil; $SR_j$ is the radius of each saddle deflector coil; $S(Zl)_j$ is the length along the optical axis of each saddle deflector coil; $S\phi_j$ is the semi-angle of each saddle deflector coil; $C(R1)_k$ and $C(R2)_k$ are the inside radius and outside radius, respectively of each compound saddle deflector coil; $C(Zl)_k$ is the length along the optical axis of each compound saddle deflector coil; and $C\theta_k$ is the semi-angle of each compound saddle deflector coil.

By way of example, applying Equation (1) to a deflector according to the invention comprising a compound saddle deflector coil having an inside radius of 35 mm, an outside radius of 74 mm, a length along the optical axis of 45 mm, and a semi-angle of 36°; and a toroidal coil having an inside radius of 35 mm, an outside radius of 74 mm, a length along the optical axis of 45 mm, and a semi-angle of 72° yields the following:

$$JT_1 \cdot I_{OT3}(35,74,45,72°) + JC_1 \cdot I_{OC3}(35,74,45,36°) = 0 \quad (22)$$

For the excitation current value, $JT_1 = JC_1(1.81)$ is obtained. FIG. 8 shows the circumstances when the $\cos[3\phi]$ component of a magnetic field is suppressed using this excitation-current ratio.

The same analysis can be applied to a deflector comprising deflector coils having the same configuration but wherein the coils have different radii and/or z lengths, e.g., a deflector having all toroidal coils.

The same principle can be applied to the suppression of the $\cos[5\phi]$ component of the magnetic field by solving the following:

$$\sum_{i=1}^{l} JT_i \cdot I_{OT5}(T(R1)_i, T(R2)_i, T(Zl)_i, T\theta_i) + \\ \sum_{j=1}^{m} JS_j \cdot I_{OS5}(SR_j, S(Zl)_j, S\theta_j) + \\ \sum_{k=1}^{n} JC_k \cdot I_{OC5}(C(R1)_k, C(R2)_k, C(Zl)_k, C\theta_k) = 0 \quad (9)$$

In addition, a solution to Equation (1) can be obtained while including a limiting condition such as having the respective Ampere-Turn values for each coil be an integer ratio of one another and making the radius, inside radius, outside radius or semi-angle of the coil an unknown quantity. With such a calculation, the respective currents applied to each deflector coil can be made equal by imposing restrictions on the shape of each deflector coil or by making the number of windings in each coil according to the integer ratio. Thus, it is possible to simplify the driver (power supply) used to supply current to the deflector coils.

For example, consider a deflector comprising a first toroidal coil having an inside radius of 35 mm, an outside radius of 74 mm, an axial length of 45 mm, and a semi-angle of 90°; a second toroidal coil having an inside radius of 35 mm, an outside radius of 74 mm, an axial length of 45 mm, and a semi-angle of $\theta_2$; and a compound saddle coil having an inside radius of 35 mm, an outside radius of 74 mm, an axial length of 45 mm, and a semi-angle of $\theta_3$. Equation (1) and Equation (9) are solved simultaneously for $\theta_2$ and $\theta_3$ with the Ampere-Turn values for each of the respective coils being equal:

$$JT_1 \cdot I_{OT3}(35,74,45,90°) + JT_2 \cdot I_{OT3}(35,74,45,\theta_2) + JC_1 \cdot I_{OC3}(35,74,45,\theta_3) = 0 \quad (23)$$

$$JT_1 \cdot I_{OT5}(35,74,45,90°) + JT_2 \cdot I_{OT5}(35,74,45,\theta_2) + JC_1 \cdot I_{OC5}(35,74,45,\theta_3) = 0 \quad (24)$$

$$JT_1 = JT_2 = JC_1 \quad (25)$$

From the above, $\theta_2 = 39°$ and $\theta_3 = 69.5°$. By configuring the coils of the deflector with respective angular configurations derived in such a manner, the constituent deflector coils can share a single driver (power supply), thereby decreasing the number of drivers required and reducing costs.

Deflectors can thus be designed that are effective in suppressing four-fold aberration. However, when manufacturing precision is poor, unexpected four-fold aberrations may arise. In order to decrease these unexpected four-fold aberrations, the excitation current applied to the deflector can be adjusted to intentionally create a $\cos[3\phi]$ component in the magnetic field, thereby canceling out the existing four-fold aberrations. This will be explained below.

Figure 12:
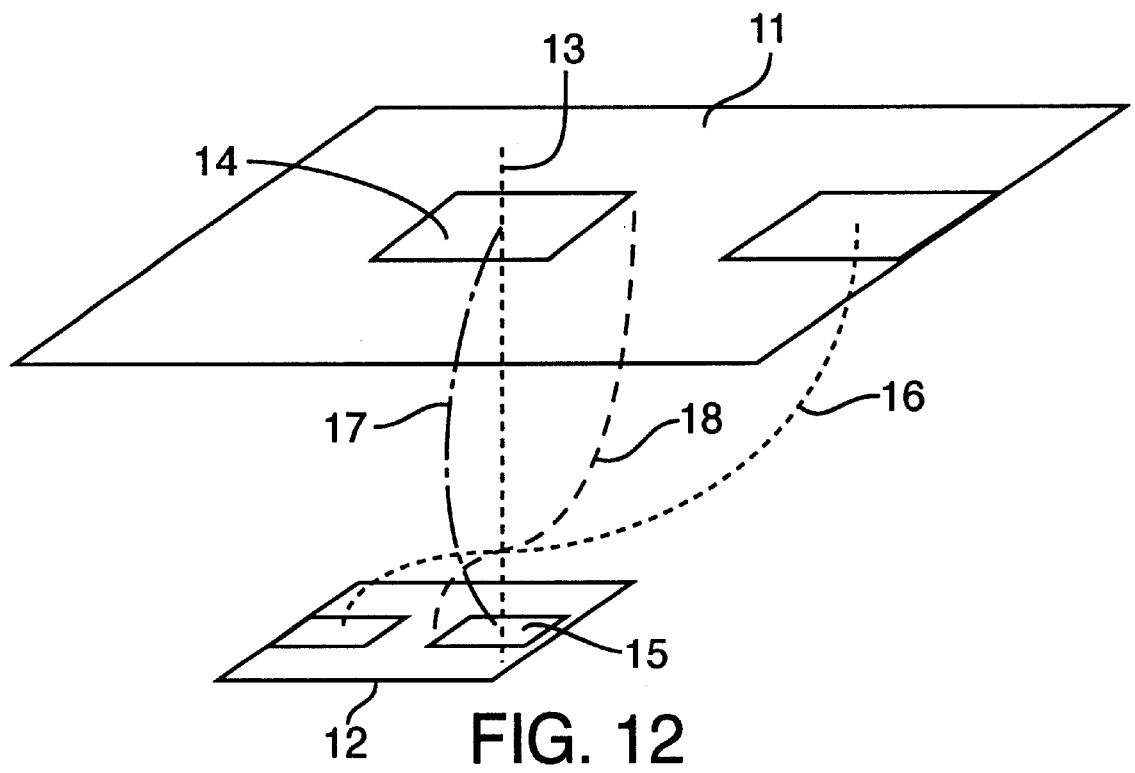
FIG. 12 shows the trajectories of electrons (or other charged particles) propagating downstream of the reticle plane.
Figure 13:
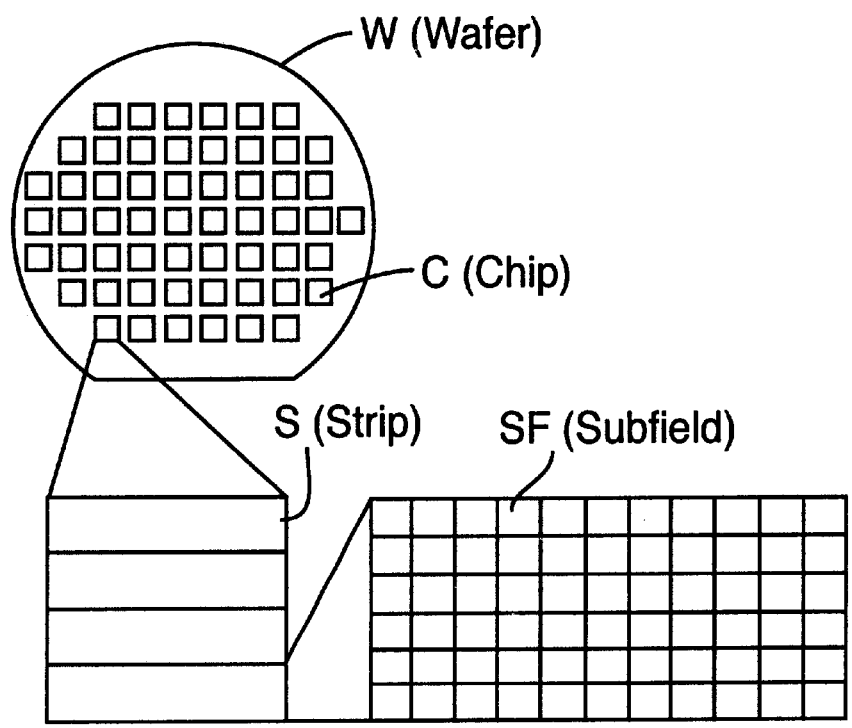
FIG. 13 illustrates a conventional configuration of the reticle and substrate for performing divided projection transfer.

The trajectory of electrons exiting the reticle plane is shown in FIG. 12. In FIG. 12, item 11 is the reticle, item 12 is the wafer, item 13 is the optical axis, item 14 is the reference surface on the reticle 11, item 15 is the projected image of the reference surface 14, item 16 is the general electron trajectory as deflected, item 17 is the so-called "focusing trajectory" ($w_a$) of the electrons propagating outward at the reticle at an angle from the optical axis, and item 18 is the so-called "projection trajectory" ($w_b$) of electrons propagating perpendicularly to the reticle from a point separated by a unit distance from the optical axis at the reticle. The trajectories $w_a(z)$ and $w_b(z)$ are expressed as respective complex trajectories in which the X-axis is the real axis and the Y-axis is the imaginary axis.

Four-fold aberrations are classified as "four-fold distortion" and "four-fold blur." Four-fold blur includes "four-fold coma" and "four-fold hybrid astigmatism." Four-fold distortion includes "four-fold hybrid distortion." Four-fold coma $\delta w_{g(4\ coma)}$, four-fold hybrid astigmatism $\delta w_{g(4\ as)}$, and four-fold hybrid distortion $\delta w_{g(4\ dis)}$ at the image plane are respectively expressed as:

$$\delta w_{g(4\ coma)} = -\frac{1}{\sqrt{V}\,(\overline{w_a'}(z_i))} \int_{z_o}^{z_i} \sqrt{V}\,[D_3(z) \cdot (\overline{w_a})^3(z)]\,dz \quad (26)$$

$$\delta w_{g(4\ as)} = -\frac{1}{\sqrt{V}\,(\overline{w_a'}(z_i))} \int_{z_o}^{z_i} \sqrt{V}\,[D_3(z) \cdot (\overline{w_a})^2(z) \cdot (\overline{w_b})(z)]\,dz \quad (27)$$

$$\delta w_{g(4\ dis)} = -\frac{1}{\sqrt{V}\,(\overline{w_a'}(z_i))} \int_{z_o}^{z_i} \sqrt{V}\,[D_3(z) \cdot (\overline{w_a})(z) \cdot (\overline{w_b})^2(z)]\,dz \quad (28)$$

respectively. In Equations (26)–(28), V is the acceleration voltage, $z_1$ is the z coordinate of the image plane, $z_o$ is the z coordinate of the object plane (reticle plane), the bars indicate complex conjugate functions, a prime (') indicates a derivative with respect to z, and $D_3(z)$ is the sum of the $\cos[3\phi]$ components of the magnetic field of each deflector coil imparted to the electrons at position z.

Four-fold hybrid distortion is obtained by integrating the integrand that is strongly dependent on the projection trajectory $w_b(z)$. As shown in FIG. 12, the profile of the projection trajectory $w_b(z)$ is larger (by the transfer magnification) on the reticle-plane side than on the substrate side. Therefore, corrective action involving an intentional generation of a $\cos[3\phi]$ component in the magnetic field (to cancel out four-fold aberrations) is more intense if the deflectors upstream of the scattering aperture are used rather than the deflectors downstream of the scattering aperture.

Four-fold coma and four-fold hybrid astigmatism have integrands having little dependence on the projection trajectory $w_b(z)$. Hence, correcting four-fold distortion using a deflector immediately downstream of the reticle plane has the advantage of the $\cos[3\phi]$ component being generated in the magnetic field for corrective purposes, thereby making it difficult for new four-fold blurs to arise. Conversely, when four-fold blur is corrected by creating a cos[3ϕ] component in the magnetic field using a deflector situated between the scattering aperture and the substrate surface, very little new four-fold distortion is generated because the projection trajectory $w_b(z)$ is small at this z position. Since four-fold hybrid astigmatism is more dependent on the projection trajectory $w_b(z)$ than on four-fold coma, it is possible to correct four-fold hybrid astigmatism on the reticle-plane side of the scattering aperture.

When adjusting the excitation current applied to the deflectors to create a cos[3ϕ] component in the magnetic field sufficient to correct four-fold aberrations, if the magnitude of the current is changed drastically, the cos[ϕ] component and the cos[5ϕ] component of the magnetic field created by the deflector will change and the deflection sensitivity will change. This can cause shifting of the image position and generation of higher-order aberrations. This potential problem is resolved by setting the respective currents according to Equation (9), above, and Equation (5), below:

$$\sum_{i=1}^{l} JT_i \cdot I_{OTI}(T(R1)_i, T(R2)_i, T(Zl)_i, T\theta_i) + \qquad (5)$$

$$\sum_{j=1}^{m} JS_j \cdot I_{OSI}(SR_j, S(Zl)_j, S\theta_j) +$$

$$\sum_{k=1}^{n} JC_k \cdot I_{OCI}(C(R1)_k, C(R2)_k, C(Zl)_k, C\theta_k) = Const.$$

For example, consider a deflector, according to the invention, comprising a compound saddle coil having an inside radius of 35 mm, an outside radius of 74 mm, a z-length of 45 mm, and a semi-angle of 36°; and a toroidal coil having an inside radius of 35 mm, an outside radius of 74 mm, a z-axis length of 45 mm, and a semi-angle of 72°. These values can be applied to Equation (5) to yield:

$$JT_1 \cdot I_{OT1}(35,74,45,72°) + JC_1 \cdot I_{OC1}(35,74,45,36°) = 1 \qquad (29)$$

Solving for the excitation current, $$JC_1 = 0.608 - (0.952)JT_1$$

is obtained. A 3ϕ component can be generated in the magnetic field to cancel four-fold aberrations without substantially changing the deflection sensitivity of the deflector. This can be done by gradually adjusting $JC_1$, using $JT_1$ as a parameter, so that the relationship in Equation (5) is satisfied.

Similarly, a 3ϕ component can be generated in the magnetic field to cancel four-fold aberrations without changing the cos[5ϕ] component in the magnetic field generated by the deflector. This is achieved by setting the current applied to the coil such that Equation (9) is satisfied.

Table 2 lists the results of decreasing four-fold blur in the electron-beam microlithographic exposure apparatus shown in FIG. 1. In the apparatus, each of the deflectors P1–P4 comprises a compound saddle coil having an inside radius of 19 mm, an outside radius of 47 mm, an axial length of 27 mm, and a semi-angle of 36°; and a toroidal coil having an inside radius of 19 mm, an outside radius of 47 mm, an axial length of 27 mm, and a semi-angle of 72°. Four-fold coma and four-fold hybrid astigmatism are reduced by the deflectors P1–P4 by changing the current applied to the 72° toroidal coil to satisfy Equation (9). Four-fold coma and four-fold hybrid astigmatism can be decreased without altering the incident angle of the beam to the surface of the sensitive substrate or the magnitude of "normal" aberrations. The "normal" aberrations referred to here are aberrations commonly observed in electron-optical systems or other CPB optical systems.

TABLE 2

|  |  | Before Adjust | After Adjust |
| --- | --- | --- | --- |
| Incident angle to sensitive substrate (°) |  | 0.096 | 0.096 |
| Normal aberrations (nm) | Blur | 108.9 | 108.8 |
|  | Distortion | 5.7 | 5.6 |
| Four-fold aberrations (nm) | Coma | 7.7 | 1.1 |
|  | Hybrid astigmatism | 5.9 | 1.0 |
|  | Blur | 9.7 | 1.5 |
|  | Hybrid distortion | 0.0 | 0.4 |
| 72° Toroidal Coil Relative Current (JT1) | C4 | 0.46863 | 0.46863 |
|  | C5 | 0.46863 | 0.46863 |
|  | P1 | 0.39786 | 0.39680 |
|  | P2 | 0.39786 | 0.39715 |
|  | P3 | 0.39786 | 0.39801 |
|  | P4 | 0.39786 | 0.39720 |

Table 3 lists the results of further diminishing the four-fold distortion in the electron-beam microlithography apparatus of FIG. 1 after the adjustments noted in Table 2. The adjustments leading to the data in Table 3 were made using deflectors, according to the invention, comprising a compound saddle coil having an inside radius of 35 mm, an outside radius of 74 mm, an axial length of 45 mm, and a semi-angle of 36°; and a toroidal coil having an inside radius of 35 mm, an outside radius of 74 mm, an axial length of 45 mm, and a semi-angle of 72° for deflectors C1–C8. The ratio of the respective excitation currents applied to deflectors C4 and C5 was adjusted. Four-fold distortion was decreased without substantially changing four-fold blur by adjusting the deflectors upstream of the scattering aperture.

By subsequently decreasing four-fold blur by adjusting the deflectors P1–P4 and decreasing four-fold distortion by adjusting the deflectors C4 and C5, overall four-fold aberrations were satisfactorily suppressed.

TABLE 3

|  |  | Before Adjust | After Adjust |
| --- | --- | --- | --- |
| Incident angle to sensitive substrate (°) |  | 0.096 | 0.096 |
| Normal aberrations (nm) | Blur | 108.8 | 108.8 |
|  | Distortion | 5.6 | 5.6 |
| Four-fold aberrations (nm) | Coma | 1.1 | 1.1 |
|  | Hybrid astigmatism | 1.0 | 0.4 |
|  | Blur | 1.5 | 1.2 |
|  | Hybrid distortion | .04 | 0.0 |
| 72° Toroidal Coil Relative Current (JT1) | C4 | 0.46863 | 0.46778 |
|  | C5 | 0.46863 | 0.46933 |
|  | P1 | 0.39680 | 0.39680 |
|  | P2 | 0.39715 | 0.39715 |
|  | P3 | 0.39801 | 0.39801 |
|  | P4 | 0.39720 | 0.39720 |

With respect to a modified saddle deflector coil (in which a saddle deflector coil is replaced with a planar coil residing in a plane not intersecting the optical axis), the following Equations (31), (32), and (33) correspond to Equations (14), (17), and (20), respectively:

$$Pd_1(z, X, Yl, Zl) = \frac{NI}{4\pi} \int_{-Yl/2}^{Yl/2} \int_{-Zl/2}^{Zl/2} \left[ -\frac{2}{L^3} + \frac{6X^2}{L^5} \right] dY dZ \quad (31)$$

$$Pd_3(z, X, Yl, Zl) = \frac{NI}{4\pi} \int_{-Yl/2}^{Yl/2} \int_{-Zl/2}^{Zl/2} \left[ \frac{-5(3L^2(X^2 - Y^2) - 7(X^4 - 3X^2Y^2)}{4L^9} \right] dY dZ \quad (32)$$

$$Pd_5(z, X, Yl, Zl) = \quad (33)$$
$$\frac{NI}{4\pi} \int_{-Yl/2}^{Yl/2} \int_{-Zl/2}^{Zl/2} \left[ \frac{-63(5L^2(X^4 - 6X^2Y^2 + Y^4) - 11(X^6 - 10X^4Y^2 + 5X^2Y^4)}{64L^{13}} \right] dY dZ$$

wherein $Pd_i$ (i=1, 3, 5) corresponds with $Sd_1$, X is the radial distance from the optical axis to the modified saddle deflector coil, Yl is the length of the coil along the Y axis, and Zl is the length of the coil along the optical axis (z-axis). In Equations (32) and (33), Y is a corresponding coordinate of a random point Q (having coordinates (X,Y,Z) in an orthogonal coordinate system) on a deflector coil. In addition, the following Equations (34), (35), and (36) correspond to Equations (7), (3), and (11), respectively:

$$I_{OP1}(X, Yl, Zl) = \frac{\pi}{NI} \int_{-\infty}^{\infty} Pd_1(z, X, Yl, Zl) dz = \frac{1}{4} \left[ \frac{16(Yl)(Zl)}{4X^2 + (Yl)^2}(Zl) \right] \quad (34)$$

$$I_{OP3}(X, Yl, Zl) = \quad (35)$$
$$\frac{\pi}{NI} \int_{-\infty}^{\infty} Pd_3(z, X, Yl, Zl) dz = \frac{1}{4} \left[ \frac{-64(Yl)[-12X^2 + (Yl)^2](Zl)}{3[4X^2 + (Yl)^2]^3}(Zl) \right]$$

$$I_{OP5}(X, Yl, Zl) = \frac{\pi}{NI} \int_{-\infty}^{\infty} Pd_5(z, X, Yl, Zl) dz = \quad (36)$$
$$\frac{1}{4} \left[ \frac{256(Yl)[84X^4 - 40X^2(Yl)^2 + (Yl)^4](Zl)}{5[4X^2 + (Yl)^2]^5}(Zl) \right]$$

wherein, $I_{OPi}$ (i=1, 3, 5) corresponds with $I_{OSi}$. Therefore, whenever a modified saddle deflector coil is used, these equations may be used instead of the respective equations for the saddle deflector coil. Namely, whenever a modified saddle deflector coil is used as a deflector coil, the foregoing equations are solved using $I_{OPi}$ instead of $I_{OSi}$.

Whenever an inner compound saddle coil is used, the following Equations (37), (38), and (39) correspond with Equations (15), (18), and (21), respectively:

$$Ad_1(z, R1, R2, Zl, \theta) = Td_1(z, R1, R2, Zl, \theta) + Sd_1(z, R1, Zl, \theta) \quad (37)$$

$$Ad_3(z, R1, R2, Zl, \theta) = Td_3(z, R1, R2, Zl, \theta) + Sd_3(z, R1, Zl, \theta) \quad (38)$$

$$Ad_5(z, R1, R2, Zl, \theta) = Td_5(z, R1, R2, Zl, \theta) + Sd_5(z, R1, Zl, \theta) \quad (39)$$

wherein $Ad_i$ (i=1, 3, 5) corresponds with $Cd_i$. R1 and R2 are as shown in FIG. 5, and Zl is the length of the coil along the optical axis. In addition, the following Equations (40), (41), and (42) correspond with Equations (8), (4), and (1 2), respectively:

$$I_{OA1}(R1, R2, Zl, \theta) = \quad (40)$$
$$I_{OT1}(R1, R2, Zl, \theta) + I_{OS1}(R1, R2, \theta) = \frac{4(Zl)\sin\theta}{R1} - \frac{2(Zl)\sin\theta}{R2}$$

$$I_{OA3}(R1, R2, Zl, \theta) = \quad (41)$$
$$I_{OT3}(R1, R2, Zl, \theta) + I_{OS3}(R1, Zl, \theta) = \frac{4(Zl)\sin 3\theta}{3(R1)^3} - \frac{2(Zl)\sin 3\theta}{3(R2)^3}$$

-continued $$I_{OA5}(R1, R2, Zl, \theta) = \quad (42)$$
$$I_{OT5}(R1, R2, Zl, \theta) + I_{OS5}(R1, Zl, \theta) = \frac{4(Zl)\sin 5\theta}{5(R1)^5} - \frac{2(Zl)\sin 5\theta}{5(R2)^5}$$

wherein $I_{OA1}$ (i=1, 3, 5) corresponds with $I_{OCi}$. Therefore, whenever an inner compound saddle coil is used, the foregoing equations may be used instead of the equations for the compound saddle coil. Namely, whenever an inner compound saddle deflector coil is used as a deflector coil, the equations can be solved using $I_{OAi}$ instead of $I_{OCi}$.

Figure 15:
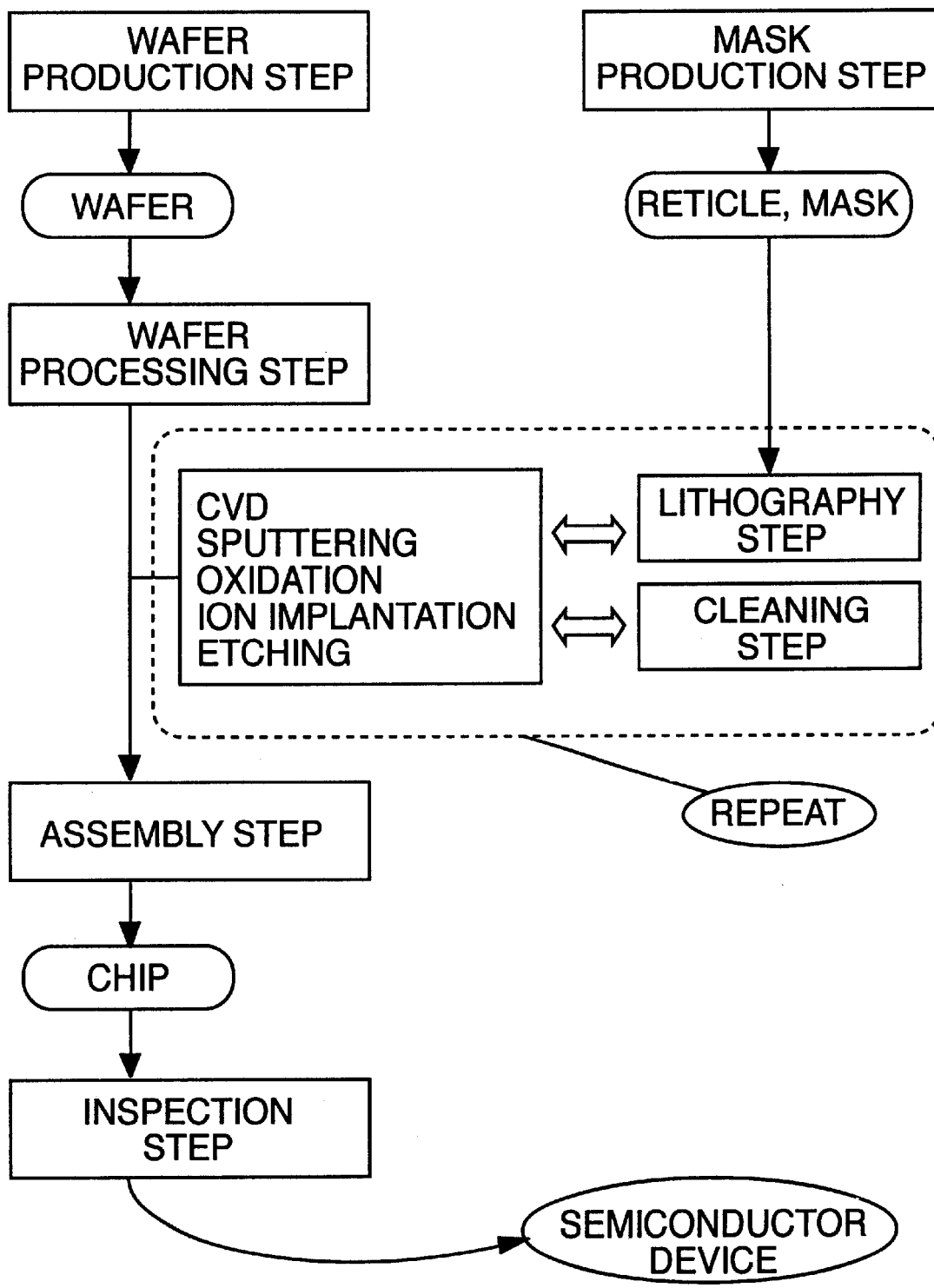
FIG. 15 is a process flowchart for manufacturing a semiconductor device, wherein the process includes a microlithography method according to the invention.

FIG. 15 is a flowchart of an exemplary semiconductor fabrication method to which apparatus and methods according to the invention can be readily applied. The fabrication method generally comprises the main steps of wafer production (wafer preparation), reticle production (reticle preparation), wafer processing, device assembly, and inspection. Each step usually comprises several sub-steps.

Among the main steps, wafer processing is key to achieving the smallest feature sizes (critical dimensions) and best inter-layer registration. In the wafer-processing step, multiple circuit patterns are successively layered atop one another on the wafer, wherein the formation of each layer typically involves multiple sub-steps. Usually, many operative semiconductor devices are produced on each wafer.

Typical wafer-processing steps include: (1) thin-film formation involving formation of a dielectric layer for electrical insulation or a metal layer for connecting wires; (2) microlithography to form a resist pattern for selective processing of the thin film or the substrate itself; (3) etching or analogous step to etch the thin film or substrate according to the resist pattern, or doping as required to implant ions or impurities into the thin film or substrate according to the resist pattern; (4) resist stripping to remove the resist from the wafer; and (5) chip inspection. Wafer processing is repeated as required (typically many times) to fabricate the desired semiconductor chips on the wafer.

FIG. 16 provides a flow chart of typical steps performed in microlithography, which is a principal step in wafer processing. The microlithography step typically includes: (1) resist-coating step, wherein a suitable resist is coated on the wafer substrate (which can include a circuit element formed in a previous wafer-processing step); (2) exposure step, to expose the resist with the desired pattern; (3) development step, to develop the exposed resist; and (4) annealing step, to enhance the durability of the resist pattern.

Methods and apparatus according to the invention can be applied to a semiconductor fabrication process, as summarized above, to provide substantially improved throughput without sacrificing accuracy or resolution.

Whereas the invention has been described in connection with multiple example embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A charged-particle-beam microlithography apparatus for transferring a pattern defined by a reticle onto a sensitive substrate, the apparatus comprising at least one deflector situated and configured for deflecting the charged particle beam, the deflector comprising at least one inner compound saddle deflector coil.

2. A charged-particle-beam microlithography apparatus for transferring a pattern defined by a reticle onto a sensitive substrate, the apparatus comprising at least one deflector situated and configured for deflecting the charged particle beam, the deflector comprising at least two independent deflector coils of different type and including an inner compound saddle deflector coil.

3. A charged-particle-beam microlithography apparatus for transferring a pattern defined by a reticle onto a sensitive substrate, the apparatus comprising at least one deflector situated and configured for deflecting the charged particle beam, the deflector comprising at least two independent deflector coils of different type and including a combination of at least one toroidal deflector coil and a saddle deflector coil, the saddle deflector coil having a semi-angle of no greater than 45°.

4. The apparatus of claim 3, wherein:

the deflector comprises a combination of a toroidal deflector coil and a saddle deflector coil; and the toroidal deflector coil has a semi-angle of approximately 72°, and the saddle deflector coil has a semi-angle of approximately 36°.

5. The apparatus of claim 3, wherein:

the deflector comprises a combination of first and second toroidal deflector coils and a saddle deflector coil; and the first toroidal deflector coil has a semi-angle of approximately 54°, the second toroidal deflector coil has a semi-angle of approximately 90° and the saddle deflector coil has a semi-angle of approximately 18°.

6. A charged-particle-beam microlithography apparatus for transferring a pattern defined by a reticle onto a sensitive substrate, the apparatus comprising at least one deflector situated and configured for deflecting the charged particle beam, the deflector comprising at least two deflector coils of different type and including a combination of a toroidal deflector coil and a modified saddle deflector coil having a plane-parallel portion situated in a plane that does not intesect an optical axis of the deflector.

7. A charged-particle-beam microlithography apparatus for transferring a pattern defined by a reticle onto a sensitive substrate, the apparatus comprising at least one deflector situated and configured for deflecting the charged particle beam, the deflector comprising at least two deflector coils of different type and including a combination of a toroidal deflector and a compound saddle deflector coil.

8. The apparatus of claim 7, wherein the deflector comprises a combination of at least one toroidal deflector coil and a compound saddle deflector coil, the compound saddle deflector coil having a semi-angle of no more than 45°.

9. The apparatus of claim 8, wherein:

the deflector comprises a combination of one toroidal deflector coil and one compound saddle deflector coil; and the toroidal deflector coil has a semi-angle of approximately 72°, and the compound saddle deflector coil has a semi-angle of approximately 36°.

10. The apparatus of claim 8, wherein:

the deflector comprises a combination of first and second toroidal deflector coil and one saddle deflector coil; and the first toroidal deflector coil has a semi-angle of approximately 54°, the second toroidal deflector coil has a semi-angle of approximately 90°, and the compound saddle deflector coil has a semi-angle of approximately 18°.

11. The apparatus of claim 8, wherein:

the deflector comprises a combination of first and second toroidal deflector coils one saddle deflector coil;

the first toroidal deflector coil has a semi-angle of approximately 69.5°, the second toroidal deflector coil has a semi-angle of approximately 90°, and the compound saddle deflector coil has a semi-angle of approximately 39°.

12. The apparatus of claim 7, wherein the deflector comprises a combination of a toroidal deflector coil and a modified compound saddle deflector coil having a plane-parallel portion situated in a plane that does not intersect an optical axis of the deflector.

13. A charged-particle-beam microlithography apparatus for transferring a pattern defined by a reticle onto a sensitive substrate, the apparatus comprising at least one deflector situated and configured for deflecting the charged particle beam, the deflector comprising at least two deflector coils of different type, wherein each of the independent deflector coils has an Ampere-Turn value satisfying the following:

$$\sum_{i=1}^{l} JT_i \cdot I_{OT3}(T(R1)_i, (T(R2))_i, (T(Zl))_i, T\theta_i) +$$

$$\sum_{j=1}^{m} JS_j \cdot I_{OS3}(SR_j, (S(Zl))_j, S\theta_j) +$$

$$\sum_{k=1}^{n} JC_k \cdot I_{OC3}((C(R1))_k, (C(R2))_k, (C(Zl))_k, C\theta_k) = 0$$

wherein, with respect to said deflector, l is the number of toroidal deflector coils; m is the number of saddle deflector coils; n is the number of compound saddle deflector coils; $JT_i$, $JS_j$, and $JC_k$ are Ampere-Turn values of the toroidal deflector coil(s), saddle deflector coil(s), and compound saddle deflector coil(s), respectively; $T(R1)_i$ and $T(R2)_i$ are inside and outside radii, respectively, of the toroidal deflector coil(s); $T(Zl)_i$ is a length along the optical axis of each toroidal deflector coil; $T\theta_i$ is a semi-angle of each toroidal deflector coil; $SR_j$ is a radius of each saddle deflector coil; $S(Zl)_j$ is the length along the optical axis of each saddle deflector coil; $S\theta_j$ is a semi-angle of each saddle deflector coil; $C(R1)_k$ and $C(R2)_k$ are inside and outside radii, respectively, of each compound saddle deflector coil; $C(Zl)_k$ is a length along the optical axis of each compound saddle deflector coil; $C\theta_k$ is a semi-angle of each compound saddle deflector coil; $I_{OT3}(R1,R2,Zl,\theta)$ is an index function for each toroidal deflector coil, expressed as:

$$I_{OT3}(R1, R2, Zl, \theta) =$$

$$\frac{\pi}{NI} \int_{-\infty}^{\infty} Td_3(z, R1, R2, Zl, \theta) dz = \left[\frac{2}{3(R1)^3} - \frac{2}{3(R2)^3}\right](Zl)\sin 3\theta$$

wherein R1 and R2 are inside and outside radii, respectively, Zl is a length along the optical axis, and θ is a semi-angle of said toroidal deflector coil; $I_{OS3}(R,Zl,\theta)$ is an index function for each saddle deflector coil, expressed as:

$$I_{OS3}(R, Zl, \theta) = \frac{\pi}{NI} \int_{-\infty}^{\infty} Sd_3(z, R, Zl, \theta) dz = \frac{2(Zl)\sin 3\theta}{3R^3}$$

wherein R is a radius, Zl is a length along the optical axis, and $\theta$ is a semi-angle of said saddle deflector coil; and $I_{OC3}(R1,R,Z,\theta)$ is an index function for each compound saddle deflector coil, expressed as:

$$I_{OC3}(R1, R2, Zl, \theta) = I_{OT3}(R1, R2, Zl, \theta) + I_{OS3}(R2, Zl, \theta) = \frac{2(Zl)\sin 3\theta}{3(R1)^3}$$

wherein R1 and R2 are inside and outside radii, respectively, Zl is a length along the optical axis, and $\theta$ is a semi-angle of said compound saddle deflector coil.

14. The apparatus of claim 13, comprising at least one deflector satisfying none of the following conditions:
   (a) comprising a toroidal deflector coil having an inside radius, outside radius, and length along the optical axis that are identical to the inside radius, outside radius, and length, respectively, of all deflector coils in said deflector;
   (b) comprising a saddle deflector coil having a radius and length along the optical axis that are identical to the radius and length, respectively, of all deflector coils in said deflector; and
   (c) comprising a compound saddle deflector coil having an inside radius, outside radius, and length along the optical axis that are identical, respectively, to the inside radius, outside radius, and length, respectively, of all deflector coils in said deflector.

15. The apparatus of claim 14, further comprising a deflector comprising multiple deflector coils, each having a respective semi-angle such that the value of the Ampere-Turn value for each deflector coil in said deflector is substantially an integer ratio.

16. The apparatus of claim 14, wherein, in at least one deflector having multiple deflector coils, each deflector coil has a length along its optical axis so as to provide a respective Ampere-Turn value for each deflector coil in the deflector, the respective Ampere-Turn values for the deflector coils in the deflector being substantially at an integer ratio of one another.

17. The apparatus of claim 14, wherein, in at least one deflector having multiple deflector coils including a saddle deflector coil or a modified saddle deflector coil, the saddle deflector coil has a radius or the modified saddle deflector coil has a distance from the optical axis providing a respective Ampere-Turn value for each deflector coil in the deflector, the respective Ampere-Turn values for the deflector coils in the deflector being substantially at an integer ratio of one another.

18. The apparatus of claim 14, wherein, in at least one deflector having multiple deflector coils including a toroidal deflector coil, the toroidal deflector coil has an inside radius or outside radius serving to provide a respective Ampere-Turn value for each deflector coil in the deflector, the respective Ampere-Turn values for the deflector coils in the deflector being substantially at an integer ratio of one another.

19. The apparatus of claim 14, wherein, in at least one deflector having multiple deflector coils including a compound saddle deflector coil or a modified compound saddle deflector coil, the compound saddle deflector coil or modified compound saddle deflector coil has an inside radius or outside radius so as to provide a respective Ampere-Turn value for each deflector coil in the deflector, the respective Ampere-Turn values for the deflector coils in the deflector being substantially at an integer ratio of one another.

20. A charged-particle-beam microlithography apparatus for transferring a pattern defined by a reticle onto a sensitive substrate, the apparatus comprising:
   at least one deflector situated and configured for deflecting the charged particle beam, the deflector comprising at least two deflector coils of different type, wherein, with respect to at least one deflector having two or more independent deflector coils, each deflector coil in the deflector is energized with a respective excitation current that inhibits four-fold aberration; and
   a scattering aperture wherein, with respect to at least one deflector situated downstream of the scattering aperture and having two or more independent deflector coils, each deflector coil in the deflector is energized with a respective excitation current that inhibits four-fold blur aberration.

21. A charged-particle-beam microlithography apparatus for transferring a patter defined by a reticle onto a sensitive substrate, the apparatus comprising:
   at least one deflector situated and configured for deflecting the charged particle beam, the deflector comprising at least two deflector coils of different type, wherein, with respect to at least one deflector having two or more independent deflector coils, each deflector coil in the deflector is energized with a respective excitation current that inhibits four-fold aberration; and
   a scattering aperture wherein, with respect to at least one deflector situated downstream of the scattering aperture and having two or more independent deflector coils, each deflector coil in the deflector is energized with a respective excitation current that inhibits four-fold coma aberration.

22. A charged-particle-beam microlithography apparatus for transferring a pattern defined by a reticle onto a sensitive substrate, the apparatus comprising:
   at least one deflector situated and configured for deflecting the charged particle beam, the deflector comprising at least two deflector coils of different type, wherein, with respect to at least one deflector having two or more independent deflector coils, each deflector coil in the deflector is energized with a respective excitation current that inhibits four-fold aberration; and
   a scattering aperture wherein, with respect to at least one deflector situated upstream of the scattering aperture and having two or more independent deflector coils, each deflector coil in the deflector is energized with a respective excitation current that inhibits four-fold distortion aberration.

23. A charged-particle-beam microlithography apparatus for transferring a pattern defined by a reticle onto a sensitive substrate, the apparatus comprising at least one deflector situated and configured for deflecting the charged particle beam, the deflector comprising at least two deflector coils of different type, wherein, with respect to at least one deflector having two or more independent deflector coils (a) each deflector coil in the deflector is energized with a respective excitation current that inhibits four-fold aberration, and (b) the respective excitation current applied to each deflector coil is adjustable to a respective value that inhibits four-fold aberration without substantially changing a deflection sensitivity of the deflector.

24. The apparatus of claim 23, wherein, with respect to the deflector in which the respective excitation currents applied to the deflector coils inhibit four-fold aberration, the excitation currents satisfy the following:

$$\sum_{i=1}^{l} JT_i \cdot I_{OT1}(T(R1)_i, T(R2)_i, (T(Zl)_i, T\theta_i) + \sum_{j=1}^{m} JS_j \cdot I_{OS1}(SR_j, (S(Zl)_j, S\theta_j) +$$

$$\sum_{k=1}^{n} JC_k \cdot I_{OC1}(C(R1)_k, C(R2)_k, C(Zl)_k, C\theta_k) = Const.$$

wherein, with respect to said deflector, l is the number of toroidal deflector coils; m is the number of saddle deflector coils; n is the number of compound saddle deflector coils; $JT_i$, $JS_j$, and $JC_k$ are Ampere-Turn values in the toroidal deflector coil(s), saddle deflector coil(s), and compound saddle deflector coil(s), respectively; $T(R1)_i$ and $T(R2)_i$ are inside and outside radii, respectively, of the toroidal deflector coil(s); $T(Zl)_i$ is a length along the optical axis of each toroidal deflector coil; $T\theta_i$ is a semi-angle of each toroidal deflector coil; $SR_j$ is a radius of each saddle deflector coil; $S(Zl)_j$ is a length along the optical axis of each saddle deflector coil; $S\theta_j$ is a semi-angle of each saddle deflector coil; $C(R1)_k$ and $C(R2)_k$ are inside and outside radii, respectively, of each compound saddle deflector coil; $C(Zl)_k$ is length along the optical axis of each compound saddle deflector coil; $C(Zl)_k$ is a semi-angle of each compound saddle deflector coil; $I_{OT1}(R1,R2,Zl,\theta)$ is an index function for each toroidal deflector coil, expressed as:

$$I_{OT1}(R1, R2, Zl, \theta) = \frac{\pi}{NI} \int_{-\infty}^{\infty} Td_1(z, R1, R2, Zl, \theta) dz = \left[\frac{2}{(R1)} - \frac{2}{(R2)}\right](Zl)\sin\theta$$

wherein R1 and R2 are inside and outside radii, respectively, Zl is a length along the optical axis, and θ is a semi-angle of said toroidal deflector coil; $I_{OS1}(R,Zl,\theta)$ is an index function for each saddle deflector coil, expresses as:

$$I_{OS1}(R, Zl, \theta) = \frac{\pi}{NI} \int_{-\infty}^{\infty} Sd_1(z, R, Zl, \theta) dz = \frac{2(Zl)\sin\theta}{R}$$

wherein R is a radius, Zl is a length along the optical axis, and θ is a semi-angle of said saddle deflector coil; and $I_{OC1}(R1,R2,Zl,\theta)$ is an index function for each compound saddle deflector coil, expressed as:

$$I_{OC1}(R1, R2, Zl, \theta) = I_{OT1}(R1, R2, Zl, \theta) + I_{OS3}(R2, Zl, \theta) = \frac{2(Zl)\sin\theta}{R1}$$

wherein R1 aid R2 are inside and outside radii, respectively, Zl is a length along :he optical axis, and θ is a semi-angle of said compound deflector coil.

25. A charged-particle-beam microlithography apparatus for transferring a pattern defined by a reticle onto a sensitive substrate, the apparatus comprising at least one deflector situated and configured for deflecting the charged particle beam, the deflector comprising at least two deflector coils of different type, wherein, with respect to at least one deflector having two or more independent deflector coils (a) each deflector coil in the deflector is energized with a respective excitation current that inhibits four-fold aberration, and (b) each deflector coil is energized with a respective excitation current that inhibits four-fold aberration without substantially changing higher-order aberrations exhibited by the deflector.

26. The apparatus of claim 25, wherein, with respect to a deflector in which the respective excitation currents applied to the deflector coils inhibit four-fold aberration, the excitation currents satisfying the following:

$$\sum_{i=1}^{l} JT_i \cdot I_{OT5}((T(R1))_i, (T(R2))_i, (T(Zl))_i, T\theta_i) +$$

$$\sum_{j=1}^{m} JS_j \cdot I_{OS5}(SR_j, (S(Zl))_j, S\theta_j) +$$

$$\sum_{k=1}^{n} JC_k \cdot I_{OC5}((C(R1))_k, (C(R2))_k, (C(Zl))_k, C\theta_k) = 0$$

wherein, with respect to said deflector, l is the number of toroidal deflector coils; m is the number of saddle deflector coils; n is the number of compound saddle deflector coils; $JT_i$, $JS_j$, and $JC_k$ are Ampere-Turn values of the toroidal deflector coil(s), saddle deflector coil(s), and compound saddle deflector coil(s), respectively; $T(R1)_i$ and $T(R2)_i$ are inside and outside radii, respectively, of the toroidal deflector coil(s); $T(Zl)_i$ is a length along the optical axis of each toroidal deflector coil; $T\theta_i$ is a semi-angle of each toroidal deflector coil; $SR_j$ is a radius of each saddle deflector coil; $S(Zl)_j$ is a length along the optical axis of each saddle deflector coil; $S\theta_j$ is a semi-angle of each saddle deflector coil; $C(R1)_k$ and $C(R2)_k$ are inside and outside radii, respectively, of each compound sa deflector coil; $C(Zl)_k$ is a length along the optical axis of each compound saddle deflector coil; $C\theta_k$ is a semi-angle of each compound saddle deflector coil; $I_{OT5}(R1,R2,Zl,\theta)$ is an index function for each toroidal deflector coil, expressed as:

$$I_{OT5}(R1, R2, Zl, \theta) = \frac{\pi}{NI} \int_{-\infty}^{\infty} Td_5(z, R1, R2, Zl, \theta) dz = \left[\frac{2}{5(R1)^5} - \frac{2}{5(R2)^5}\right](Zl)\sin 5\theta$$

wherein R1 and R2 are inside and outside radii, respectively, Zl is a length along the optical axis, and θ is a semi-angle of said toroidal deflector coil; $I_{OS5}(R,Zl,\theta)$ is an index function for each saddle deflector coil, expresses as:

$$I_{OS5}(R, Zl, \theta) = \frac{\pi}{NI} \int_{-\infty}^{\infty} Sd_5(z, R, Zl, \theta) dz = \frac{2(Zl)\sin 5\theta}{5R^5}$$

wherein R is radius, Zl is a length along the optical axis, and θ is semi-angle of said saddle deflector coil; and $I_{OC1}(R1, R2,Zl,\theta)$ is an index function for each compound saddle deflector coil, expressed as:

$$I_{OC5}(R1, R2, Zl, \theta) = I_{OT5}(R1, R2, Zl, \theta) + I_{OS5}(R2, Zl, \theta) = \frac{2(Zl)\sin 5\theta}{5(R1)^5}$$

wherein R1 and R2 are inside and outside radii, respectively, Zl is a length along the optical axis, and θ is a semi-angle of said compound deflector coil.

27. A method for reducing four-fold aberrations in a charged-particle-beam (CPB) microlithography system for transferring a pattern defined by a reticle onto a sensitive substrate, the system including a CPB optical system, the method comprising the steps:
   (a) providing at least one deflector in association with the CPB-optical system;

(b) configuring the at least one deflector to have at least two independent deflector coils of different type; and (c) applying electrical energy to the deflector so as to reduce at least one of blur and distortion of an image produced by the CPB-optical system;

wherein each of the independent deflector coils is configured to have an Ampere-Turn value satisfying the following:

$$\sum_{i=1}^{l} JT_i \cdot I_{OT3}((T(R1))_i, (T(R2))_i, (T(Zl))_i, T\theta_i) +$$

$$\sum_{j=1}^{m} JS_j \cdot I_{OS3}(SR_j, (S(Zl))_j, S\theta_j) +$$

$$\sum_{k=1}^{n} JC_k \cdot I_{OC3}((C(R1))_k, (C(R2))_k, (C(Zl))_k, C\theta_k) = 0$$

wherein, with respect to said deflector, l is the number of toroidal deflector coils; m is the number of saddle deflector coils; n is the number of compound saddle deflector coils; $JT_i$, $JS_j$, and $JC_k$ are Ampere-Turn values of the toroidal deflector coil(s), saddle deflector coil(s), and compound saddle deflector coil(s), respectively; $T(R1)_i$ and $T(R2)_i$ are inside and outside radii, respectively, of the toroidal deflector coil(s); $T(Zl)_i$ is a length along the optical axis of each toroidal deflector coil; $T\theta_i$ is a semi-angle of each toroidal deflector coil; $SR_j$ is a radius of each saddle deflector coil; $S(Zl)_j$ is the length along the optical axis of each saddle deflector coil; $S\theta_j$ is a semi-angle of each saddle deflector coil; $C(R1)_k$ and $C(R2)_k$ are inside and outside radii, respectively, of each compound saddle deflector coil; $C(Zl)_k$ is a length along the optical axis of each compound saddle deflector coil; $C\theta_k$ is a semi-angle of each compound saddle deflector coil; $I_{OT3}(R1,R2,Zl,\theta)$ is an index function for each toroidal deflector coil, expressed as:

$$I_{OT3}(R1, R2, Zl, \theta) = \frac{\pi}{NI} \int_{-\infty}^{\infty} Td_3(z, R1, R2, Zl, \theta) dz = \left[\frac{2}{3(R1)^3} - \frac{2}{3(R2)^3}\right](Zl)\sin 3\theta$$

wherein R1 and R2 are inside and outside radii, respectively, Zl is a length along the optical axis, and θ is a semi-angle of said toroidal deflector coil; $I_{OS3}(R,Zl,\theta)$ is an index fiction for each saddle deflector coil, expressed as:

$$I_{OS3}(R, Zl, \theta) = \frac{\pi}{NI} \int_{-\infty}^{\infty} Sd_3(z, R, Zl, \theta) dz = \frac{2(Zl)\sin 3\theta}{3R^3}$$

wherein R is a radius, Zl is a length along the optical axis, and θ is a semi-angle of said saddle deflector coil; and $I_{OC3}(R1,R2,Zl,\theta)$ is an index function for each compound saddle deflector coil, expressed as:

$$I_{OC3}(R1, R2, Zl, \theta) = I_{OT3}(R1, R2, Zl, \theta) + I_{OS3}(R2, Zl, \theta) = \frac{2(Zl)\sin 3\theta}{3(R1)^3}$$

wherein R1 and R2 are inside and outside radii, respectively, Zl is a length along the optical axis, and θ is a semi-angle of said compound saddle deflector coil.

28. A semiconductor-fabrication process, comprising the steps of:

(a) preparing a wafer;

(b) processing the wafer; and (c) assembling devices formed on the wafer during steps (a) and (b), wherein step (b) comprises performing projection microlithography with reduced four-fold aberrations as recited in claim 27.

29. A semiconductor-fabrication process, comprising the steps of:

(a) preparing a wafer;

(b) processing the wafer; and (c) assembling devices formed on the wafer during steps (a) and (b), wherein step (b) comprises the steps of (i) applying a resist to the wafer; (ii) exposing the resist; (iii) developing the resist; and (iv) annealing the resist; and step (ii) comprises providing a charged-particle-beam projection-exposure apparatus as recited in claim,; and using the charged-particle-beam projection-exposure apparatus to expose the resist with the pattern defined on the reticle.

* * * * *

UNITED STATES PATENT AND TRADEMARK OFFICE
CERTIFICATE OF CORRECTION

PATENT NO.   : 6,507,027 B1
DATED         : January 14, 2003
INVENTOR(S) : Kojima et al.

It is certified that error appears in the above-identified patent and that said Letters Patent is hereby corrected as shown below:

Title page,
Item [56], References Cited, OTHER PUBLICATIONS, "Munro et al." reference, "Compatution" should be -- Computation --.

Column 3,
Line 22, "trigonometry" should be -- trigonometric --.
Line 31, "four-fold a aberrations" should be -- four-fold aberrations --.

Column 6,
Line 23, "$SR_i$" should be -- $SR_j$ --.
Line 30, "$I_{OT3}$ (R1, R2, $Z\ell\theta$)" should be -- $I_{OT3}$ (R1, R2, $Z\ell$, $\theta$) --.

Column 8,
Line 41, "SOj" should be -- $S\theta_j$ --.
Line 42, "C(R1)k" should be -- $C(\mathbf{R1})_k$ --.
Line 65, "Sd, (R1, R1, $Z\ell$, $\theta$)," should be -- $Sd_1$ (R1, R2, $Z\ell$, $\theta$) --.

Column 9,
Line 31, "$_{C(R1),}$" should be -- $C(\mathbf{R1})$, --.

Column 12,
Line 38, "Z2-Z1)" should be -- (Z2-Z1) --.

Column 14,
Line 38, "$\cos[3\theta]$" should be -- $\cos[3\phi]$ --.

Column 15,
Lines 19 and 53, "Z2-Z1)" should be -- (Z2-Z1) --.
Line 54, "value of e" should be -- value of $\theta$ --.

Column 16,
Line 66, "$\sin[3\phi]$" should be -- $\sin[3\theta]$ --.

Column 17,
Lines 11 and 26, "$\sin[3\phi]$" should be -- $\sin[3\theta]$ --.
Line 18, "coil) $\sin[3 \times 72º]:\sin[3 \times 36º]$" should be -- coil) = $\sin[3 \times 72º]:\sin[3 \times 36º]$ --.

UNITED STATES PATENT AND TRADEMARK OFFICE
CERTIFICATE OF CORRECTION

PATENT NO. : 6,507,027 B1
DATED : January 14, 2003
INVENTOR(S) : Kojima et al.

It is certified that error appears in the above-identified patent and that said Letters Patent is hereby corrected as shown below:

Column 18,
Line 56, "p is" should be -- $\ell$ is --.
Line 65, "T$\phi_i$" should be -- T$\theta_i$ --.
Line 67, "S$\phi j$" should be -- S$\theta_j$ --.

Column 23,
Line 57, "(1 2)" should be -- (12) --.
Lines 60-62, equation (40) should be:

$$I_{OA1}(R1,R2,Z\ell,\theta) = I_{OT1}(R1,R2,Z\ell,\theta) + I_{OS1}(R1,Z\ell,\theta)$$
$$= \frac{4(Z\ell)\sin\theta}{R1} - \frac{2(Z\ell)\sin\theta}{R2}$$

Column 25,
Line 49, "intesect" should be -- intersect --.

Column 26,
Lines 32-38, the equation should be:

$$\sum_{i=1}^{\ell} JT_i \cdot I_{OT3}(T(R1)_i,T(R2)_i,T(Z\ell)_i,T\theta_i) + \sum_{j=1}^{m} JS_j \cdot I_{OS3}(SR_j,S(Z\ell)_j,S\theta_j)$$
$$+ \sum_{k=1}^{n} JC_k \cdot I_{OC3}(C(R1)_k,C(R2)_k,C(Z\ell)_k,C\theta_k) = 0$$

Column 27,
Line 9, "$I_{OC3}(R_1, R, Z, \theta)$" should be -- $I_{OC3}(R1, R2, Z\ell, \theta)$ --.

Column 29,
Line 30, "C(Zl)$_k$" should be -- C$\theta_k$ --.
Line 43, "expresses" should be -- expressed --.
Line 57, ":he" should be -- the --.

Column 30,
Lines 10-15, the equation should be:

$$\sum_{i=1}^{\ell} JT_i \cdot I_{OT5}(T(R1)_i,T(R2)_i,T(Z\ell)_i,T\theta_i) + \sum_{j=1}^{m} JS_j \cdot I_{OS5}(SR_j,S(Z\ell)_j,S\theta_j)$$
$$+ \sum_{k=1}^{n} JC_k \cdot I_{OC5}(C(R1)_k,C(R2)_k,C(Z\ell)_k,C\theta_k) = 0$$

UNITED STATES PATENT AND TRADEMARK OFFICE
CERTIFICATE OF CORRECTION

PATENT NO. : 6,507,027 B1
DATED : January 14, 2003
INVENTOR(S) : Kojima et al.

It is certified that error appears in the above-identified patent and that said Letters Patent is hereby corrected as shown below:

Column 30 (cont'd),
Line 27, "$Sr_i$" should be -- $SR_j$ --.
Line 44, "expresses" should be -- expressed --.
Line 64, "CPB optical" should be -- CPB-optical --.

Column 31,
Lines 10-16, the equation should be:

$$\sum_{i=1}^{\ell} JT_i \cdot I_{OT3}(T(R1)_i, T(R2)_i, T(Z\ell)_i, T\theta_i) + \sum_{j=1}^{m} JS_j \cdot I_{OS3}(SR_j, S(Z\ell)_j, S\theta_j) + \sum_{k=1}^{n} JC_k \cdot I_{OC3}(C(R1)_k, C(R2)_k, C(Z\ell)_k, C\theta_k) = 0$$

Column 32,
Line 1, "fiction" should be -- function --.
Line 40, "claim,;" should be -- claim 2; --.

Signed and Sealed this

Tenth Day of August, 2004

JON W. DUDAS
*Acting Director of the United States Patent and Trademark Office*